US007579914B2

(12) United States Patent
Amano

(10) Patent No.: US 7,579,914 B2
(45) Date of Patent: Aug. 25, 2009

(54) BIAS CIRCUIT AND POWER AMPLIFIER

(75) Inventor: Yoshihisa Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 28 days.

(21) Appl. No.: 11/902,843

(22) Filed: Sep. 26, 2007

(65) Prior Publication Data

US 2008/0079495 A1   Apr. 3, 2008

(30) Foreign Application Priority Data

Sep. 29, 2006 (JP) ............................ 2006-269550
Jun. 13, 2007 (JP) ............................ 2007-156749

(51) Int. Cl.
*H03F 3/04* (2006.01)

(52) U.S. Cl. .................................... 330/296

(58) Field of Classification Search ................ 330/296, 330/133, 285, 288
See application file for complete search history.

(56) References Cited

U.S. PATENT DOCUMENTS

| 6,043,714 | A | 3/2000 | Yamamoto et al. | |
|---|---|---|---|---|
| 6,750,721 | B2 * | 6/2004 | Patterson | ............... 330/295 |
| 2001/0054933 | A1 | 12/2001 | Miyazawa | |
| 2002/0167358 | A1 | 11/2002 | Sakuno | |
| 2004/0189398 | A1 | 9/2004 | Noh et al. | |
| 2005/0174177 | A1 | 8/2005 | Moriwaki et al. | |
| 2006/0066398 | A1 | 3/2006 | Akamine et al. | |

FOREIGN PATENT DOCUMENTS

| JP | 60-097706 | 5/1985 |
|---|---|---|
| JP | 08-063244 A | 9/1996 |
| JP | 11-068473 A | 3/1999 |
| JP | 11-163640 | 6/1999 |
| JP | 2001-094360 | 4/2001 |
| JP | 2002-009558 | 1/2002 |
| JP | 2002-116831 | 4/2002 |

(Continued)

OTHER PUBLICATIONS

Design Technique of Analog Integrated Circuits for System LSI (I), P.R. Gray et al. (translated under the supervision of K. Asada and Y. Nagata), Forth Edition, Baifukan Co. Ltd., Jul. 2003, pp. 352-353, 358-359.

*Primary Examiner*—Benny Lee
*Assistant Examiner*—Khiem D Nguyen
(74) *Attorney, Agent, or Firm*—Harness, Dickey & Pierce, P.L.C.

(57) ABSTRACT

A bias circuit includes: a first transistor having a base terminal grounded via a resistor, and a collector terminal connected to a first power supply port via an adjustment resistor; a second transistor having an emitter terminal connected to the base terminal of the first transistor, and a base terminal connected to the collector terminal of the first transistor; a third transistor having a base terminal connected to the base terminal of the first transistor, and a collector terminal connected to the first power supply port via an adjustment resistor; and a fourth transistor having a base terminal connected to the collector terminal of the third transistor, a current being taken out from the emitter terminal of the fourth transistor. This arrangement makes it possible to suppress a consuming current and output a bias current that is more stable against a temperature change and/or a power supply voltage change.

12 Claims, 12 Drawing Sheets

FOREIGN PATENT DOCUMENTS

| | | |
|---|---|---|
| JP | 2003-229730 A | 8/2003 |
| JP | 2003-324325 | 11/2003 |
| JP | 2004-172681 | 6/2004 |
| JP | 2004-274433 | 9/2004 |
| JP | 2004-297806 | 10/2004 |
| JP | 2006-94076 | 4/2006 |
| WO | WO 02/07085 | 1/2002 |

* cited by examiner

US 7,579,914 B2

BIAS CIRCUIT AND POWER AMPLIFIER

This Nonprovisional application claims priority under 35 U.S.C. §119(a) on Patent Application No. 269550/2006 filed in Japan on Sep. 29, 2006, and Patent Application No. 156749/2007 filed in Japan on Jun. 13, 2007, the entire contents of which are hereby incorporated by reference.

FIELD OF THE INVENTION

The present invention relates to a bias circuit and a power amplifier, more specifically, to a method of improving stability of a bias circuit made of a bipolar transistor and a power amplifier including the bias circuit against a power supply voltage change and/or a temperature change.

BACKGROUND OF THE INVENTION

Conventionally, a power amplifier is one of essential electronic components in a transmitter circuit used, for example, in a portable phone. The power amplifier amplifies at once an electric signal having a small power of several mW order generated by a signal processing IC (Integrated Circuit) to an electric signal having a large power close to one W order, and transmits the amplified electric signal to a transmitting antenna.

In recent years, an MMIC (Microwave Monolithic Integrated Circuit) composed of a GaAs-HBT (Ga—As Heterojunction Bipolar Transistor) is typically used as a device for a power amplifier. A bipolar power amplifier should be provided with two kinds of bias terminals that include a base bias terminal generally called "Vbb terminal" and a collector bias terminal generally called "Vcc terminal".

The power amplifier here is an electronic component that handles an outstandingly large signal power among signal powers handled by all electronic components of a portable phone. Thus, two factors of the power amplifier are considered to be important. First, a high efficiency design technique is important because superiority of power utilization efficiency of the power amplifier directly influences battery consumption. Second, a sophisticated linearization design technique is important because the power amplifier is one of the components in which signal distortion occurs most frequently due to non-linearity.

It is known that design of a bias circuit including the Vbb terminal is particularly important for realization of the high power utilization efficiency and the sophisticated linearization in the bipolar power amplifier that is typically used in the recent years. Such a view is explained in detail in many documents, for example, Japanese Unexamined Patent Publication No. 94360/2001 (Tokukai 2001-94360 (published on Apr. 6, 2001)) (Publicly Known Document 1).

A design technique of a bias circuit in a bipolar transistor is in the field of a Si (silicon) analog IC which field is publicly known field studied for a long time. However, there are more constraints in a GaAs power amplifier MMIC than in the conventional Si analog IC. Accordingly, exactly the same technique as a technique for the conventional Si analog IC cannot be applied to the GaAs power amplifier MMIC. Therefore, a new modified bias circuit has been continuously studied.

The followings are examples of a constraint peculiar to the GaAs power amplifier MMIC. First, because a threshold voltage inherent to the transistor itself is large, only two transistors can be connected (cascade-connected) between a power supply (typically 3.3V) and the ground. Second, because the MMIC deals with a large power signal, the bias circuit (direct current circuit) section tends to be influenced by other high frequency circuit section. Accordingly, separation between the two circuit sections needs to be considered.

Many documents disclose various circuit configurations as conventional techniques of designing a bias circuit suitable for the GaAs power amplifier MMICs. A technique for improving stability of a bias circuit is disclosed in Japanese Unexamined Patent Publication No. 163640/1999 (Tokukaihei 11-163640 (published on Jun. 18, 1999)) (Publicly Known Document 2) and Japanese Unexamined Patent Publication No. 9558/2002 (Tokukai 2002-9558 (published on Jan. 11, 2002)) (Publicly Known Document 3).

A bias circuit as disclosed in the Publicly Known Document 2 has a configuration of a basic bias circuit for improving stability of the bias circuit. Moreover, a bias circuit as disclosed in the Publicly Known Document 3 has a configuration of a modified bias circuit that improves stability more than the basic bias circuit.

Now, with reference to FIG. 8, first explained is a configuration of a conventional first bias circuit having a configuration of the basic bias circuit as disclosed in the Publicly Known Document 2. Then, with reference to FIG. 10, explained is a configuration of a conventional second bias circuit that is a modified bias circuit as disclosed in the Publicly Known Document 3.

FIG. 8 is a circuit diagram illustrating a configuration of the conventional first bias circuit.

The conventional first bias circuit, as illustrated in FIG. 8, includes a first transistor 501, a second transistor 502, a resistor 503, an adjustment resistor 504, a third transistor 506, an adjustment resistor 507, and an adjustment resistor 508. Moreover the first transistor 501, the second transistor 502, the resistor 503, and the adjustment resistor 504 constitute a circuit block section 505.

The first bias circuit is used to supply a bias current to a base terminal of a high frequency amplifying transistor 523. The high frequency amplifying transistor 523 amplifies a high frequency signal received from an input port 521 and outputs the amplified high frequency signal to an output port 522.

In the first bias circuit, a current mirror reflects a potential stabilized by the circuit block section 505 to the third transistor 506. With this reflected potential, the first bias circuit stably operates the third transistor 506 at a constant current.

The circuit block section 505 is provided with power from a first power supply port 5 11. The third transistor 506 receives a collector bias from a second power supply port 512 via the adjustment resistor 507 and a base bias from the circuit block section 505 (a potential at a point H in FIG. 9 explained later). The third transistor 506 supplies an emitter output to a base terminal of the high frequency amplifying transistor 523 via the adjustment resistor 508 or the like according to need.

A stabilized potential is explained above to be taken out from the circuit block section 505. Now, characteristics of the circuit block section 505 are explained in detail. The circuit block section 505 constitutes a reference power supply circuit. Therefore, it is possible to take out a stabilized potential from the circuit block section 505.

The reference power supply circuit is a publicly known circuit and, for example, described as a "current reference circuit" in "Design Technique of Analog Integrated Circuits for System LSI (I)" (P. R. Gray et al., Forth Edition, Baifukan Co. Ltd., July, 2003, p. 359). The current reference circuit becomes a "voltage reference circuit" according to usage. Therefore, in this specification, the circuit is uniformly referred to as "reference power supply circuit" so that unnecessary distinction is avoided.

With reference to FIG. 9, the reference power supply circuit is explained in detail.

FIG. 9 is a circuit diagram illustrating a configuration of a reference power supply circuit 600.

As illustrated in FIG. 9, the reference power supply circuit 600 includes a first transistor 601, a second transistor 602, a resistor 603, and an adjustment resistor 604. The first transistor 601 corresponds to the first transistor 501, the second transistor 602 to the second transistor 502, the resistor 603 to the resistor 503, and the adjustment resistor 604 to the adjustment resistor 504.

The first transistor 601 and the second transistor 602 have a feedback relationship in which the first transistor 601 and the second transistor 602 compensate each other. In other words, an input terminal (base terminal) and an output terminal (collector terminal) of the first transistor 601 are connected to an output terminal (emitter terminal) and an input terminal (base terminal) of the second transistor 602, respectively.

Moreover, the collector terminal of the first transistor 601 is connected to a first power supply port 611 via an adjustment resistor 604 and the emitter terminal thereof is grounded. The collector terminal of the second transistor 602 is connected to a second power supply port 612 and the emitter terminal of the second transistor 602 is grounded via a resistor 603.

Accordingly, a point H and a point I as illustrated in FIG. 9 are separated from influences of the first power supply port 611 and the second power supply port 612 in the circuit. This keeps potentials at the point H and the point I constant regardless of a power supply voltage change.

This stabilizes the reference power supply circuit 600 against a power supply voltage change. The third transistor 506 in the first bias circuit as in FIG. 8 receives a base bias from a potential at the point H in FIG. 9.

The reference power supply circuit 600 as illustrated in FIG. 9 is widely known as a typical stable power supply circuit whose dependency on the power supply voltage is low, and often used in practice. With reference to FIG. 3, an idea of the characteristic such that the reference power supply circuit has low dependency on the power supply voltage is explained.

FIG. 3 is a graph illustrating a stability of each circuit against a power supply voltage change. A horizontal axis indicates a power supply voltage given to a power supply circuit as in FIG. 9 and a vertical axis indicates a voltage/current that can be taken out from the power supply circuit as in FIG. 9. Here, lines X and Y in FIG. 3 are explained. A line Z in FIG. 3 is explained later in the Embodiment.

As with the line X in FIG. 3, output voltages/currents of many simple power supply circuits show a significant monotone increase in accordance with an increase in the power supply voltage.

Meanwhile, as with the line Y in the FIG. 3, an output voltage/current of the reference power supply circuit 600 as in FIG. 9 shows a monotone increase. The slope of the graph is suppressed to be small and the output voltage/current is relatively stable. This shows that the reference power supply circuit has low dependency on the power supply voltage.

Next, with reference to FIG. 10, a configuration of a conventional second bias circuit is explained.

FIG. 10 is a circuit diagram illustrating a configuration of a conventional second bias circuit.

The conventional second bias circuit, as illustrated in FIG. 10, includes a first transistor 701, a second transistor 702, a resistor, 703, an adjustment resistor 704, a third transistor 706, an adjustment resistor 707, an adjustment resistor 708, and a fourth transistor 709. The first transistor 701, the second transistor 702, the resistor 703, and the adjustment resistor 704 constitute a circuit block section 705.

The second bias circuit is used to supply a bias current to a high frequency amplifying transistor 723. The high frequency amplifying transistor 723 that amplifies a high frequency signal received from an input port 721 and outputs the amplified high frequency signal to an output port 722.

In the second bias circuit, as with the first bias circuit, current mirrors reflect a potential stabilized by the circuit block section 705 to the third transistor 706 and the fourth transistor 709. With this reflected potential, the second bias circuit stably operates the third transistor 706 and the fourth transistor 709 at a constant current.

Power is supplied to the second bias circuit from a first power supply port 7 11 via the adjustment resistor 704 and a second power supply port 712 via the adjustment resistor 707. The second bias circuit is different from the first bias circuit in that the current mirrors are formed at the same time in two paths which are (i) between the first transistor 701 and the fourth transistor 709 and (ii) between the second transistor 702 and the third transistor 706.

More specifically, the circuit block section 705 is provided with power from the first power supply port 711. Moreover, the third transistor 706 receives a collector bias from the second power supply port 712 via the adjustment resistor 707 and a base bias from the potential at the point H as in FIG. 9. An emitter terminal of the third transistor 706 is connected to a point G. A collector terminal of the fourth transistor 709 is connected to the point G and the fourth transistor 709 receives a base bias from a potential at the point I as in FIG. 9. An emitter terminal of the fourth transistor 709 is grounded. Moreover, the third transistor 706 supplies an emitter output from the point G to a base terminal of the high frequency amplifying transistor 723 via the adjustment resistor 708 or the like according to need.

A typical bias circuit is not used by itself. For example, the typical bias circuit is connected to an amplifying transistor included in a power amplifier and used to supply a bias current to the amplifying transistor. With reference to FIG. 11, a configuration of an entire typical power amplifier that employs the second bias circuit is explained.

FIG. 11 is a schematic diagram illustrating a configuration of a conventional power amplifier that employs second bias circuits.

The conventional power amplifier is a two-stage amplifier including a power sensor 830 which amplifier amplifies a high frequency in two stages by high frequency amplifying transistors 815 and 818. A section including bias circuits 805a through 805c is a bias circuit for the two-stage amplifier including the power sensor 830.

In the power amplifier, as illustrated in FIG. 11, two high frequency amplifying transistors 815 and 818 are cascade-connected between an input port 811 and an output port 812 so as to be sandwiched by three matching circuits 814, 817, and 820. Collector biases of the two high frequency amplifying transistors 815 and 818 are provided with power from the power supply ports 816 and 819, respectively.

A part of high frequency power at an output port 812 is lead to the power sensor 830 via a capacitor 821, and outputted from an output port 813 after converted into a direct current voltage.

The power sensor 830 is typically a circuit having a configuration in which, for example, an output end of a diode 823 is grounded by a capacitor 824 in terms of high frequency and grounded by a resistor 825 in terms of a direct current. Components of the power sensor 830 are beyond the scope of the present invention and the explanation thereof does not go into in details.

The power amplifier includes three conventional second bias circuits as the bias circuits 805a through 805c. The bias circuits 805a and 805b supply base biases to the high frequency amplifying transistors 815 and 818, respectively.

Moreover, in many cases, a bias is applied to the power sensor 830 for the purpose of increasing a dynamic range. Therefore, in the conventional power amplifier, the bias circuit 805c is connected to the diode 823 via an adjustment resistor 822. The bias circuits 805a through 805c are provided with power via the power supply ports 801 through 804.

However, recently, in design of a bias circuit including a Vbb terminal that is a key to the power amplifier, in addition to problems such as realization of high efficiency and sophisticated linearization explained above, a new problem is drawing attentions. A main object of the present invention is to solve this new problem by overcoming limitations of the conventional technique.

In recent years, a level of a modulation system adopted in a wireless communication system in society is becoming higher and higher every year (ex. OFDM: Orthogonal Frequency Division Multiplexing System). Moreover, adoption of a predistortion technique (a linearization technique to superimpose, on a distortion characteristic of a power amplifier, an inverse characteristic of the distortion characteristic which is measured and recorded in advance, at the time of modulation) in an open loop system is attempted. Therefore, even a little change in a characteristic is becoming impermissible, with respect to a power amplifier.

Meanwhile, regarding a portable phone as a whole, a move to reduce cost and size does not stop. The cost and size are reduced by reducing the number of components and performance which concern a power supply circuit. Accordingly, quality of power externally supplied to the power amplifier is deteriorating.

Therefore, the power amplifier is required to further improve stability against a temperature change and/or a power supply voltage change. For improving performance of the power amplifier, the design of a bias circuit including a Vbb terminal is particularly important, as mentioned above.

The first bias circuit of the Publicly Known Document 2 does not adequately deal with a temperature change and/or a power supply voltage change. Meanwhile, in the second bias circuit of the Publicly Known Document 3, an attempt is made to improve stability against a temperature change and/or a power supply voltage change. However, the recent situation requires further improvement in the stability.

Moreover, in the second bias circuit, as illustrated in FIG. 10, a bias current is taken out from the point G. Therefore, not all the emitter current of the third transistor 706 is supplied as the bias current, but a part of the emitter current flows into the fourth transistor 709. Consequently, power consumption of the fourth transistor 709 becomes large.

However, in recent years, a power saving function (shutdown function) becomes widespread. The power saving function is intended to reduce a current (typically tens mA order) unnecessarily consumed during a waiting state of the power amplifier to substantially zero (some µA order). In an HBT type power amplifier, the simplest method of realizing the shutdown function is a method of directly driving the Vbb bias terminal by a shutdown control signal.

However, for realizing the method, it is necessary to reduce power consumption of the Vbb bias terminal in accordance with substantially zero current driving force of a shutdown control signal generated in a CMOS logic circuit. Accordingly, in a GaAs power amplifier MMIC, a consuming current to be supplied to the Vbb bias terminal is required to be reduced.

Therefore, the bias circuit is required to suppress the consuming current and to output a bias current that is more stable against the temperature change and/or the power supply voltage change.

For handling the above requirement, an increase in a circuit scale of an entire bias circuit is unavoidable. This causes a problem of a chip area increase. Therefore, a circuit capable of satisfying the above requirement needs to be realized by a circuit having a scale as small as possible. Consequently, a reduction in a chip area is also required.

SUMMARY OF THE INVENTION

The present invention is attained in view of the problems mentioned above. An object of the present invention is to provide a bias circuit and a power amplifier that can suppress a consuming current and output a bias current that is more stable against a temperature change and/or a power supply voltage change.

In order to solve the problems mentioned above, a bias circuit of the present invention includes: a first transistor having an emitter terminal grounded, a base terminal grounded via a first resistor, and a collector terminal connected to a first power supply port via a second resistor; a second transistor having an emitter terminal connected to the base terminal of the first transistor, a base terminal connected to the collector terminal of the first transistor, and a collector terminal provided with power from a second power supply port; a third transistor having an emitter terminal grounded, a base terminal connected to the base terminal of the first transistor, and a collector terminal connected to the first power supply port via a third resistor; and a fourth transistor having a base terminal connected to the collector terminal of the third transistor, and a collector terminal provided with power from a third power supply port, a current being taken out from the emitter terminal of the fourth transistor.

According to the above arrangement, the collector terminal of the first transistor is connected to the base terminal of the second transistor and the base terminal of the first transistor is connected to the emitter terminal of the second transistor. Accordingly, the first transistor and the second transistor have a feedback relationship in which the first transistor and the second transistor compensate each other. This stabilizes the base potential of the first transistor and the base potential of the second transistor against a change in a power supply voltage received from the first power supply port and the second power supply port. In other words, the base potential of the first transistor and the base potential of the second transistor have low dependency on the power supply voltage.

Because the first transistor is connected to the third transistor so as to form a current mirror, the base potential of the first transistor varies in accordance with the collector potential of the third transistor. Moreover, a loop circuit section connecting from the base terminal of the third transistor to the collector terminal of the third transistor via the first transistor, the second resistor, and the third resistor is formed in addition to an arrangement in which the emitter terminal of the third transistor is grounded and the collector terminal of the third transistor is connected to the first power supply port via the third resistor. As a result, a circuit section composed of the first transistor, the second resistor, the third resistor, and the third transistor becomes a circuit performing an operation equivalent and similar to that of a peaking voltage source.

Moreover, the arrangement further includes a fourth transistor whose base terminal is connected to the collector terminal of the third transistor and collector terminal is provided with power from the third power supply port. In the arrangement, a current is taken out from the emitter terminal of the fourth transistor. As a result, a circuit section composed of the first transistor, the second resistor, the third resistor, the third transistor, and the fourth transistor becomes a circuit that performs an operation equivalent and similar to that of a peaking current source. Therefore, the bias circuit of the present invention includes a circuit equivalent to the peaking current source.

This circuit equivalent to the peaking current source links, with a collector potential of the third transistor, a base potential of the first transistor whose stabilization against a power supply voltage change is attempted. The circuit equivalent to the peaking current source carries out peaking with respect to a power supply voltage change so that the peaking is carried out in association with an operation intended to stabilize the base potential of the first transistor against the power supply voltage change. This makes it possible to carry out an operation to flatten the characteristic of the output current.

Accordingly, in the bias circuit of the present invention, each operation explained above can be used together. More specifically, the bias circuit of the present invention includes a circuit forming a potential point whose dependency on the power voltage is low and a circuit carrying out an operation equivalent and similar to that of the peaking current source. This makes it possible to further stabilize an output by both characteristics of the two circuits mentioned above against power supply voltage change. Therefore, the bias circuit of the present invention can output a bias current that is more stable against a temperature change and/or a power supply voltage change.

In the bias circuit, a transistor having the largest consuming current is the fourth transistor. However, because a current is taken out from the emitter terminal of the fourth transistor, all the output of the fourth transistor is used as a bias current. Accordingly, no other element unnecessarily consumes the output current. Therefore, the bias circuit of the present invention can further suppress a consuming current.

For the reason mentioned above, the bias circuit of the present invention can suppress a consuming current and output a bias current that is more stable against a temperature change and/or a power supply voltage change.

A bias circuit of the present invention includes: a first transistor having an emitter terminal grounded, a base terminal grounded via a first resistor, and a collector terminal connected to a first power supply port via a second resistor; a second transistor having an emitter terminal connected to the base terminal of the first transistor, a base terminal connected to the collector terminal of the first transistor, and a collector terminal provided with power from a second power supply port; and a third transistor having an emitter terminal grounded, a base terminal connected to the base terminal of the first transistor, and a collector terminal connected to the first power supply port via a third resistor, a potential being taken out from the collector terminal of the third transistor.

According to the above arrangement, the collector terminal of the first transistor is connected to the base terminal of the second transistor and the base terminal of the first transistor is connected to the emitter terminal of the second transistor. Accordingly, the first transistor and the second transistor have a feedback relationship in which the first transistor and the second transistor compensate each other. This stabilizes the base potential of the first transistor and the base potential of the second transistor against a change in a power supply voltage received from the first power supply port and the second power supply port. In other words, the base potential of the first transistor and the base potential of the second transistor have low dependency on the power supply voltage.

Because the first transistor is connected to the third transistor so as to form a current mirror, the base potential of the first transistor varies in accordance with the collector potential of the third transistor. Moreover, a loop circuit section connecting from the base terminal of the third transistor to the collector terminal of the third transistor via the first transistor, the second resistor, and the third resistor is formed in addition to an arrangement in which the emitter terminal of the third transistor is grounded and the collector terminal of the third transistor is connected to the first power supply port via the third resistor. As a result, a circuit section composed of the first transistor, the second resistor, the third resistor, and the third transistor becomes a circuit performing an operation equivalent and similar to that of a peaking voltage source.

This circuit equivalent to the peaking voltage source links, with a collector potential of the third transistor, a base potential of the first transistor whose stabilization against a power supply voltage change is attempted. The circuit equivalent to the peaking voltage source carries out peaking with respect to a power supply voltage change so that the peaking is carried out in association with an operation intended to stabilize the base potential of the first transistor against the power supply voltage change. This makes it possible to carry out an operation to flatten the characteristic of the output voltage.

Accordingly, in the bias circuit of the present invention, each operation explained above can be used together. More specifically, the bias circuit of the present invention includes a circuit forming a potential point whose dependency on the power voltage is low and a circuit carrying out an operation equivalent and similar to that of the peaking voltage source. This makes it possible to further stabilize an output by both characteristics of the two circuits mentioned above against power supply voltage change. Therefore, the bias circuit of the present invention can output a bias voltage that is more stable against a temperature change and/or a power supply voltage change.

Moreover, in the bias circuit of the present invention, because a potential is taken out from the collector terminal of the third transistor, no current flows into other element and unnecessarily consumed.

For the reason mentioned above, the bias circuit of the present invention can suppress a consuming current and output a bias voltage that is more stable against a temperature change and/or a power supply voltage change.

In order to solve the problems mentioned above, an power amplifier of the present invention includes: a plurality of amplifying transistors; and bias circuits which supply output currents to base terminals of the plurality of amplifying transistors, respectively, each of the bias circuits including: a first transistor having an emitter terminal grounded, a base terminal grounded via a first resistor, and a collector terminal connected to a first power supply port via a second resistor; a second transistor having an emitter terminal connected to the base terminal of the first transistor, a base terminal connected to the collector terminal of the first transistor, and a collector terminal provided with power from a second power supply port; and a plurality of current generating circuits each including (i) a third transistor having an emitter terminal grounded, a base terminal connected to the base terminal of the first transistor, and a collector terminal connected to the first power supply port via a third resistor and (ii) a fourth transistor having a base terminal connected to the collector terminal of the third transistor, and a collector terminal provided with power from a third power supply port, the plurality of current generating circuits each being provided in a pair with corresponding one of the plurality of amplifying transistors, an output current being supplied from the emitter terminal of the fourth transistor in each of the plurality of current generating circuits to corresponding one of the base terminals of the plurality of amplifying transistors, the plurality of amplifying transistors each being provided in a pair with corresponding one of the plurality of current generating circuits.

According to the above arrangement, the collector terminal of the first transistor is connected to the base terminal of the second transistor and the base terminal of the first transistor is connected to the emitter terminal of the second transistor. Accordingly, the first transistor and the second transistor have a feedback relationship in which the first transistor and the second transistor compensate each other. This stabilizes the base potential of the first transistor and the base potential of the second transistor against a change in a power supply voltage received from the first power supply port and the second power supply port. In other words, the base potential of the first transistor and the base potential of the second transistor have low dependency on the power supply voltage.

Because the first transistor is connected to the third transistor so as to form a current mirror, the base potential of the first transistor varies in accordance with the collector potential of the third transistor. Moreover, a loop circuit section connecting from the base terminal of the third transistor to the collector terminal of the third transistor via the first transistor, the second resistor, and the third resistor is formed in addition to an arrangement in which the emitter terminal of the third transistor is grounded and the collector terminal of the third transistor is connected to the first power supply port via the third resistor. As a result, a circuit section composed of the first transistor, the second resistor, the third resistor, and the third transistor becomes a circuit performing an operation equivalent and similar to that of a peaking voltage source.

Moreover, the arrangement further includes a fourth transistor whose base terminal is connected to the collector terminal of the third transistor and collector terminal is provided with power from the third power supply port. In the arrangement, a current is taken out from the emitter terminal of the fourth transistor. As a result, a circuit section composed of the first transistor, the second resistor, the third resistor, the third transistor, and the fourth transistor becomes a circuit that performs an operation equivalent and similar to that of a peaking current source. Therefore, the power amplifier of the present invention includes a circuit equivalent to the peaking current source.

This circuit equivalent to the peaking current source links, with a collector potential of the third transistor, a base potential of the first transistor whose stabilization against a power supply voltage change is attempted. The circuit equivalent to the peaking current source carries out peaking with respect to a power supply voltage change so that the peaking is carried out in association with an operation intended to stabilize the base potential of the first transistor against the power supply voltage change. This makes it possible to carry out an operation to flatten the characteristic of the output current.

Accordingly, in the power amplifier of the present invention, each operation explained above can be used together. More specifically, the power amplifier of the present invention includes a circuit forming a potential point whose dependency on the power voltage is low and a circuit carrying out an operation equivalent and similar to that of the peaking current source. This makes it possible to further stabilize an output by both characteristics of the two circuits mentioned above against a power supply voltage change. Therefore, the power amplifier of the present invention can output a bias current that is more stable against a temperature change and/or a power supply voltage change.

In the bias circuit, a transistor having the largest consuming current is the fourth transistor in each of the plurality of current generating circuits. However, a current is supplied from the emitter terminal of the fourth transistor in each of the plurality of current generating circuits to each of the base terminals of the plurality of amplifying transistors each being provided in a pair with the corresponding one of the plurality of current generating circuits. Accordingly, all the output of the fourth transistor is used as a bias current. Consequently, no other element unnecessarily consumes the output current. Therefore, the power amplifier of the present invention can further suppress a consuming current.

As mentioned above, the power amplifier of the present invention can suppress a consuming current and output a bias current that is more stable against a temperature change and/or a power supply voltage change.

The third transistor in each of the plurality of current generating circuits has the base terminal connected to the base terminal of the first transistor in common and the collector terminal connected to the first power supply port in common via the third resistor. Therefore, each of the plurality of current generating circuits can include a circuit equivalent to a peaking current source, by sharing a circuit section in which the first transistor and the second resistor are connected.

Therefore, the power amplifier of the present invention does not need a circuit composed of the first transistor, the second transistor, the first resistor, and the second resistor, in each of the plurality of current generating circuits. This makes it possible to reduce a circuit scale.

For a fuller understanding of the nature and advantages of the invention, reference should be made to the ensuing detailed description taken in conjunction with the accompanying drawings.

DESCRIPTION OF THE EMBODIMENTS

Embodiment 1

The following explains one embodiment of the present invention with reference to FIGS. 1 through 6. All the transistors in the following explanation are bipolar transistors. Moreover, a bias circuit of the present embodiment is a bias circuit that supplies a bias current to a base terminal of a high frequency amplifying transistor in, for example, a GaAs-HBT power amplifier.

Figure 1:
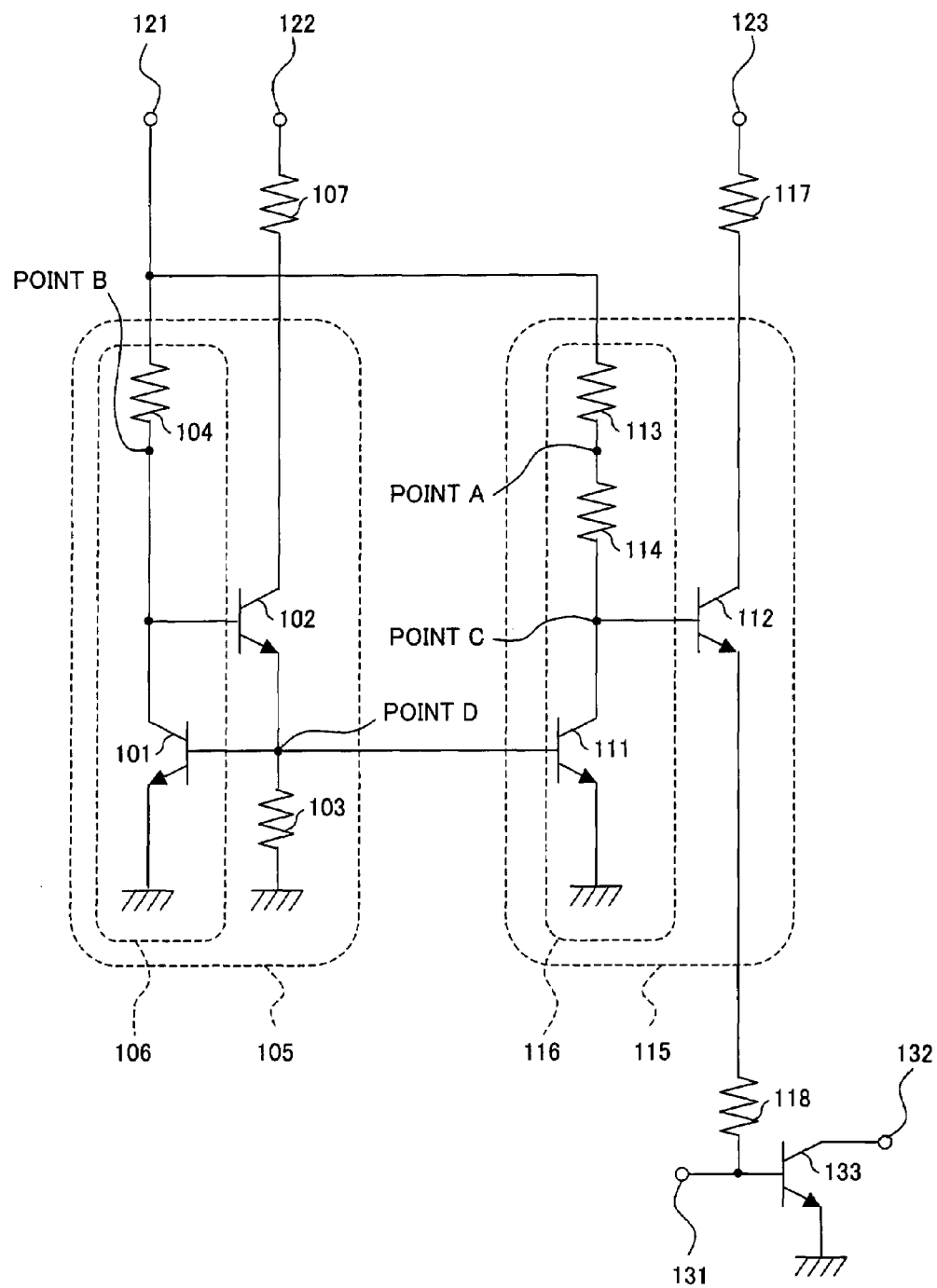
FIG. 1 is a circuit diagram illustrating a first embodiment of a bias circuit of the present invention.

FIG. 1 is a circuit diagram illustrating one example of a configuration of a bias circuit according to the present embodiment.

The bias circuit of the present embodiment includes a first transistor 101, a second transistor 102, a resistor 103, an adjustment resistor 104, an adjustment resistor 107, a third transistor 111, a fourth transistor 112, an adjustment resistor 113, an adjustment resistor 114, an adjustment resistor 117, and an adjustment resistor 118.

The bias circuit is used to supply a bias current to a base terminal of a high frequency amplifying transistor 133. The high frequency amplifying transistor 133 amplifies a high frequency signal received from an input port 131 and outputs the amplified high frequency signal to an output port 132.

The first transistor 101, the second transistor 102, the resistor 103, and the adjustment resistor 104 constitute a circuit block section 105. The circuit block section 105 has the same characteristics as a reference power supply circuit 600 explained above with reference to FIG. 9 in the Background of the Invention. Namely, the first transistor 101 corresponds to a first transistor 601, the second transistor 102 to a second transistor 602, the resistor 103 to a resistor 603, and the adjustment resistor 104 to an adjustment resistor 604.

A collector terminal of the first transistor 101 is connected to a first power supply port 121 via the adjustment resistor 104. A base terminal thereof is connected to an emitter terminal of the second transistor 102 and a base terminal of the third transistor 111, and grounded via the resistor 103. An emitter terminal of the first transistor 101 is grounded.

A collector terminal of the second transistor 102 is connected to a second power supply port 122 via the adjustment resistor 107. A base terminal of the second transistor 102 is connected to the collector terminal of the first transistor 101. An emitter terminal of the second transistor 102 is connected to the base terminal of the first transistor 101.

In this way, the collector terminal of the first transistor 101 is connected to the base terminal of the second transistor 102, and the base terminal of the first transistor 101 is connected to the emitter terminal of the second transistor 102. Therefore, the first transistor 101 and the second transistor 102 have a feedback relationship in which the first transistor 101 and the second transistor 102 compensate each other. This stabilizes the circuit block section 105 against a change in a power supply voltage received from the first power supply port 121 and the second power supply port 122.

A collector terminal of the third transistor 111 is connected to the first power supply port 121 via the adjustment resistors 114 and 113. The base terminal of the third transistor 111 is connected to the base terminal of the first transistor 101. An emitter terminal of the third transistor 111 is grounded. In this connection, the third transistor 111 is connected so as to form a current mirror with the first transistor 101.

A collector terminal of the fourth transistor 112 is connected to a third power supply port 123 via the adjustment resistor 117. A base terminal of the fourth transistor 112 is connected to the collector terminal of the third transistor 111. An emitter terminal of the fourth transistor 112 is connected to the base terminal of the high frequency amplifying transistor 133 via the adjustment resistor 118.

The third transistor 111, the fourth transistor 112, the adjustment resistors 113 and 114 constitute a current generating circuit 115. An emitter current of the fourth transistor 112 is outputted to the base terminal of the high frequency amplifying transistor 133 as a bias current of the bias circuit.

The bias circuit of the present embodiment having the above configuration includes a circuit that carries out an operation equivalent and similar to that of a peaking current source. A circuit constituting a peaking current source is disclosed in, for example, "Design Technique of Analog Integrated Circuits for System LSI (I)" (P. R. Gray et al., Forth Edition, Baifukan Co. Ltd., July, 2003, p. 353) (Publicly Known Document 4). Next, with reference to FIGS. 2 and 3, a circuit configuration and characteristics of the peaking current source as disclosed in Publicly Known Document 4 is explained.

Figure 2:
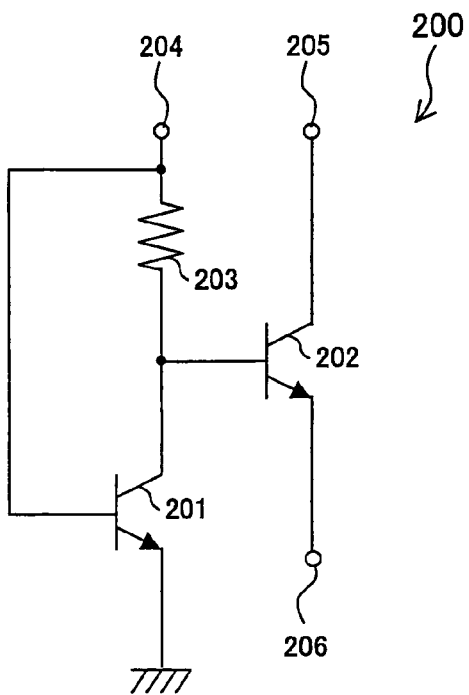
FIG. 2 is a circuit diagram illustrating a configuration of a conventional peaking current source circuit.
Figure 3:
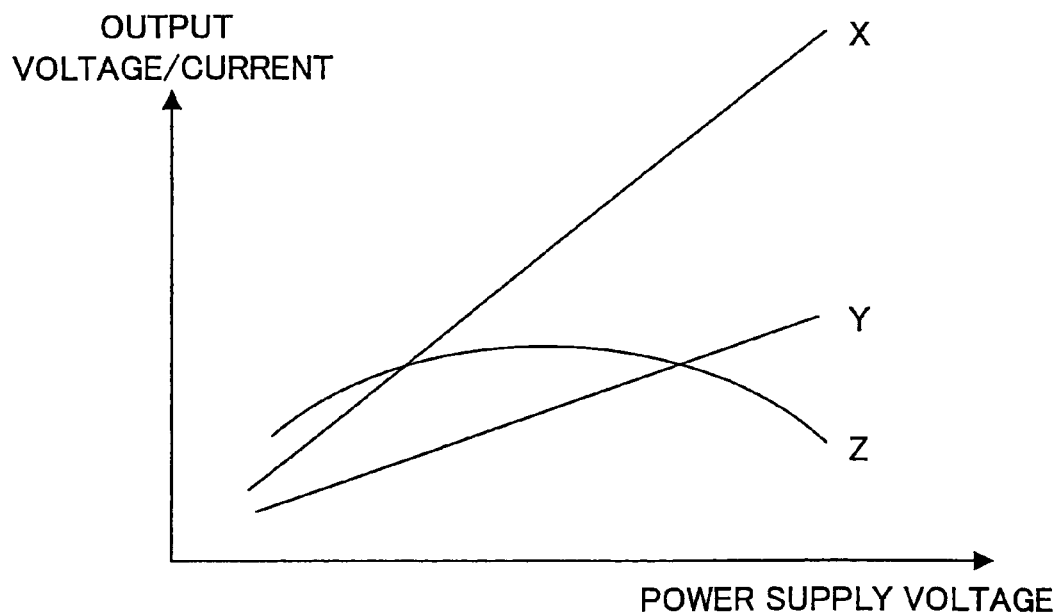
FIG. 3 is a graph illustrating a relationship between a power supply voltage and an output voltage/current.

FIG. 2 is a circuit diagram illustrating a configuration of a basic peaking current source circuit 200 as disclosed in Publicly Known Document 4. FIG. 3 is a graph illustrating a relationship between a power supply voltage and an output voltage/current.

As illustrated in FIG. 2, the peaking current source circuit 200 includes a first transistor 201, a second transistor 202, and a resistor 203.

A collector terminal of the first transistor 201 is connected to a first power supply port 204 via the transistor 203. A base terminal thereof is connected to the first power supply port 204. An emitter terminal thereof is grounded.

A collector terminal of the second transistor 202 is connected to a second power supply port 205. A base terminal of the second transistor 202 is connected to the collector terminal of the first transistor 201. An emitter terminal of the second transistor 202 is connected to an output port 206.

In a case where a circuit is constituted not as a peaking current source but as a peaking voltage source, the second transistor 202 should be removed. Namely, in such a case, the second transistor 202 is removed from the peaking current source circuit 200 as illustrated in FIG. 2, and a potential should be taken out from the collector terminal of the first transistor 201.

Next, with reference to a schematic diagram of FIG. 3, dependency of the peaking current source circuit 200 on a power supply voltage is explained, the peaking current source circuit 200 having a configuration explained above.

As with a line X as illustrated in FIG. 3, in many simple power supply circuits, an output significantly increases monotonously in accordance with an increase in the power supply voltage. Meanwhile, in a case of the reference power supply circuit 600 in FIG. 9, as with a line Y in FIG. 3, an output still monotonously increases, but the slope of the line Y is suppressed to become small. Therefore, the output is relatively stable.

Although characteristics (line X) of many simple power supply circuit and characteristics (line Y) of the reference power supply circuit 600 show monotonous increases, an output of the peaking current source circuit 200 shows peaking characteristics (line Z) having a chevron shape. It is possible to realize flat and stabilized characteristics in view of the peaking characteristics (line Z) in the vicinity of a top of the peaking.

With reference to FIG. 1, the following explains that the bias circuit of the present embodiment includes a circuit equivalent to the peaking power supply which circuit carries out an operation equivalent and similar to that of the peaking power supply.

First, a potential at a point A is substantially the same as a potential at a point B. Namely, each of the potentials at the points A and B has a value obtained by subtracting a potential of the same first power supply port 121 by a decrease in a voltage due to resistances (the adjustment resistors 104 and 113).

Because the first transistor 101 and the third transistor 111 are connected to form a current mirror, the two circuit block sections (the first circuit section 106, the second circuit section 116) have a current mirror relationship. Therefore, currents flowing in the two circuit block sections have substantially the same value. Therefore, if values of the two resistors (adjustment resistor 104, adjustment resistor 113) are set to the same value, the potential at the point A becomes substantially the same as the potential at the point B.

Moreover, though the potentials at the point B and a point D are not the same value exactly, the potential at the point B is substantially completely linked with a potential at the point D. Namely, in view of diode characteristics between the base and the emitter in the second transistor 102, it is clear that the potential at the point B is a value obtained by adding, to the potential at the point D, an offset at a substantially threshold voltage (VBE) that a semiconductor device itself naturally has.

Accordingly, the potential at the point A is substantially completely linked with the potential at the point D via the potential at the point B. Consequently, a loop from the base terminal of the third transistor 111 to the collector terminal of the third transistor 111 via the first transistor 101 and the adjustment resistors 104, 113, and 114, becomes a circuit that carries out an operation that is equivalent and similar to an operation of the circuit section, as illustrated in FIG. 2, which connects from the base terminal of the first transistor 201 to the collector terminal of the first transistor 201 via the resistor 203.

Namely, the collector terminal of the third transistor 111 is connected to the first power supply port 121 via the adjustment resistors 114 and 113, and the emitter terminal of the third transistor 111 is grounded. Accordingly, a circuit section constituted by the first transistor 101, the adjustment resistors 104, 113, and 114, and the third transistor 111 becomes a circuit carrying out an operation that is equivalent and similar to the peaking voltage source.

Moreover, a circuit section including the fourth transistor 112 in addition to the above circuit section forms a circuit section constituted by the first transistor 101, the adjustment resistors 104, 113, and 114, the third transistor 111, and the fourth transistor 112. This circuit section becomes a circuit carrying out an operation that is equivalent and similar to that of a peaking current source. Therefore, the bias circuit of the present embodiment includes a circuit equivalent to the peaking current source.

The circuit that is equivalent to the peaking current source and taken into the bias circuit links, with the potential of the point A, the potential at the point D whose stabilization against a power supply voltage change is attempted. This circuit equivalent to the peaking current source carries out peaking with respect to a power supply voltage change so that the peaking is carried out in association with an operation intended to stabilize the potential at the point D against the power supply voltage change. This makes it possible to carry out an operation to flatten the characteristic of the output current.

Figure 9:
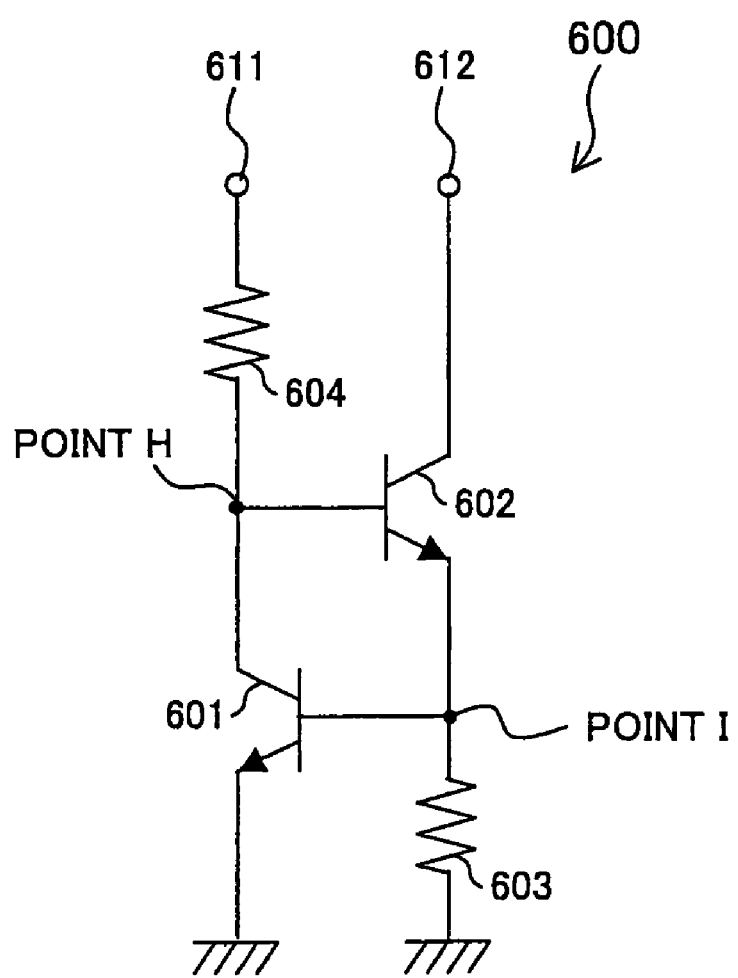
FIG. 9 is a circuit diagram illustrating a configuration of a conventional reference power supply circuit.

In the bias circuit of the present embodiment, each operation explained above can be used together. More specifically, the bias circuit of the present embodiment employs both of (i) a technique to decrease the slope of the monotonous increase (line Y) and (ii) a technique to flatten the output voltage/current by peaking (line Z), by (i) including a circuit block section 105 having the same characteristics as those of the reference power supply circuit 600 as illustrated in FIG. 9 and (ii) taking in a circuit carrying out an operation equivalent and similar to that of the peaking current source. In this way, further stabilization of an output voltage/current in the bias circuit of the present invention is attempted.

As a result, the bias circuit of the present embodiment can increase stability against a power supply voltage change by employing both of the two circuit characteristics together.

Note that a configuration of the bias circuit of the present embodiment is not limited to the configuration explained above. More specifically, many of the adjustment resistors (adjustment resistors 107, 117, and 118) are provided according to need and not essential components of the bias circuit of the present embodiment.

Moreover, although the bias circuit employs the two resistors (adjustment resistors 113 and 114) connected in series, it is not necessary in practice to have two separate resistors. The two separate resistors are used in the explanation for convenience in discussing the potential at the point A between the adjustment resistors 113 and 114.

Furthermore, a main target area of the bias circuit of the present embodiment is the bias circuit up to the fourth transistor 112. Therefore, a circuit section beyond the adjustment resistor 118 in FIG. 1 is merely one example. Accordingly, the circuit is not limited to the emitter-grounded amplifying circuit. The circuit may be an other-component grounded amplifier, a power sensor circuit, or a mixer circuit.

Figure 4:
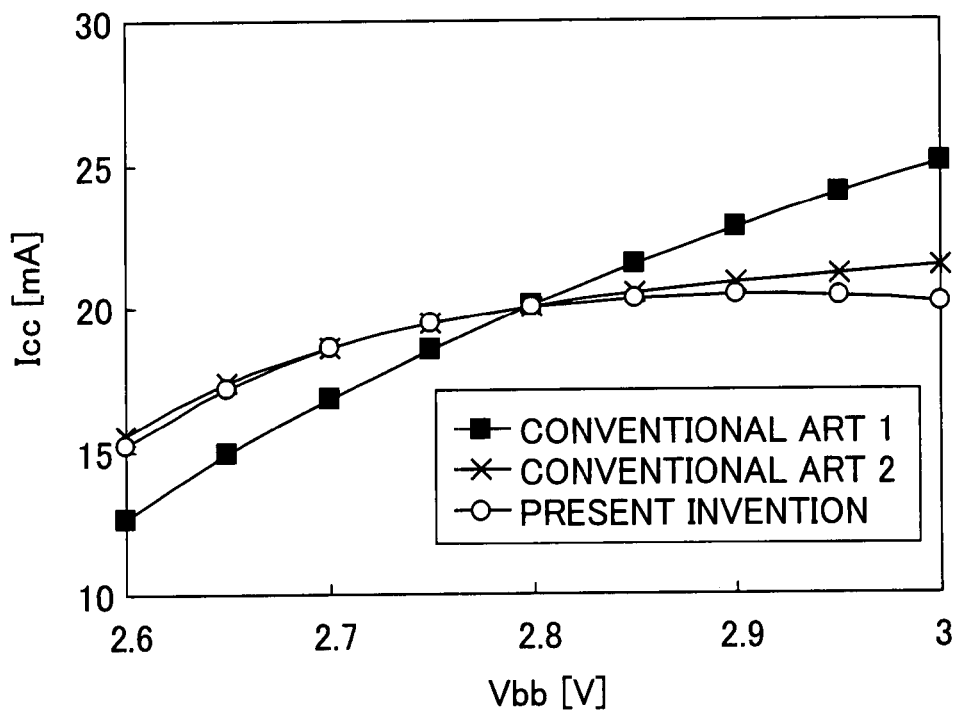
FIG. 4 is a graph illustrating a relationship between a power supply voltage and a collector idle current of a high frequency amplifying transistor.
Figure 5:
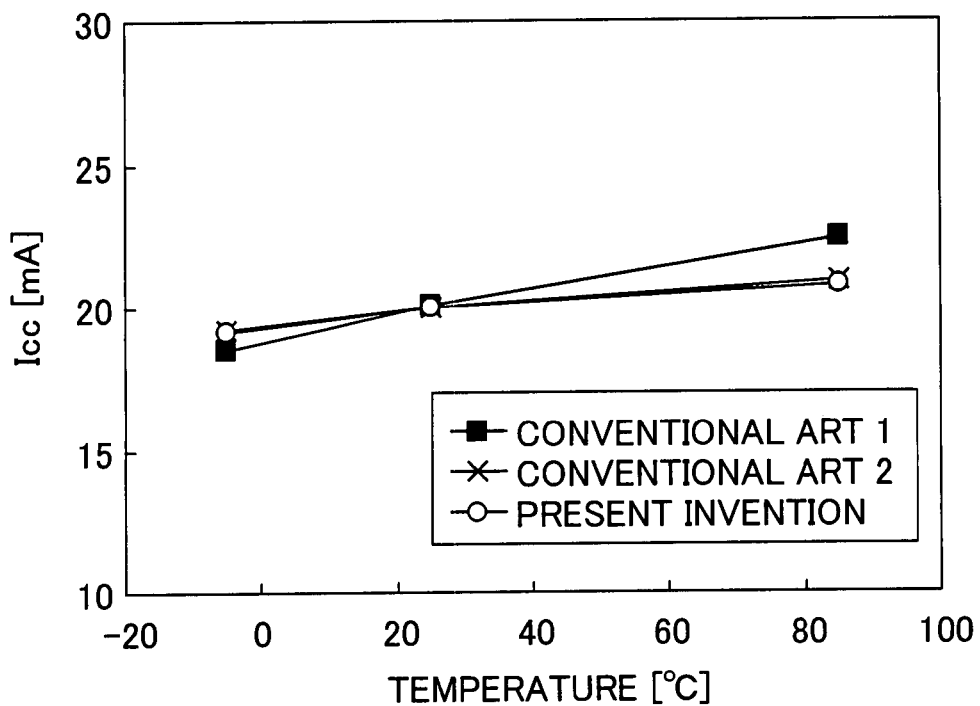
FIG. 5 is a graph illustrating a relationship between a temperature and the collector idle current of the high frequency amplifying transistor.

Next, with reference to FIGS. 4 and 5, improvement in stability against a power supply voltage change of the bias circuit of the present embodiment is explained, based on the following simulation result.

Figure 8:
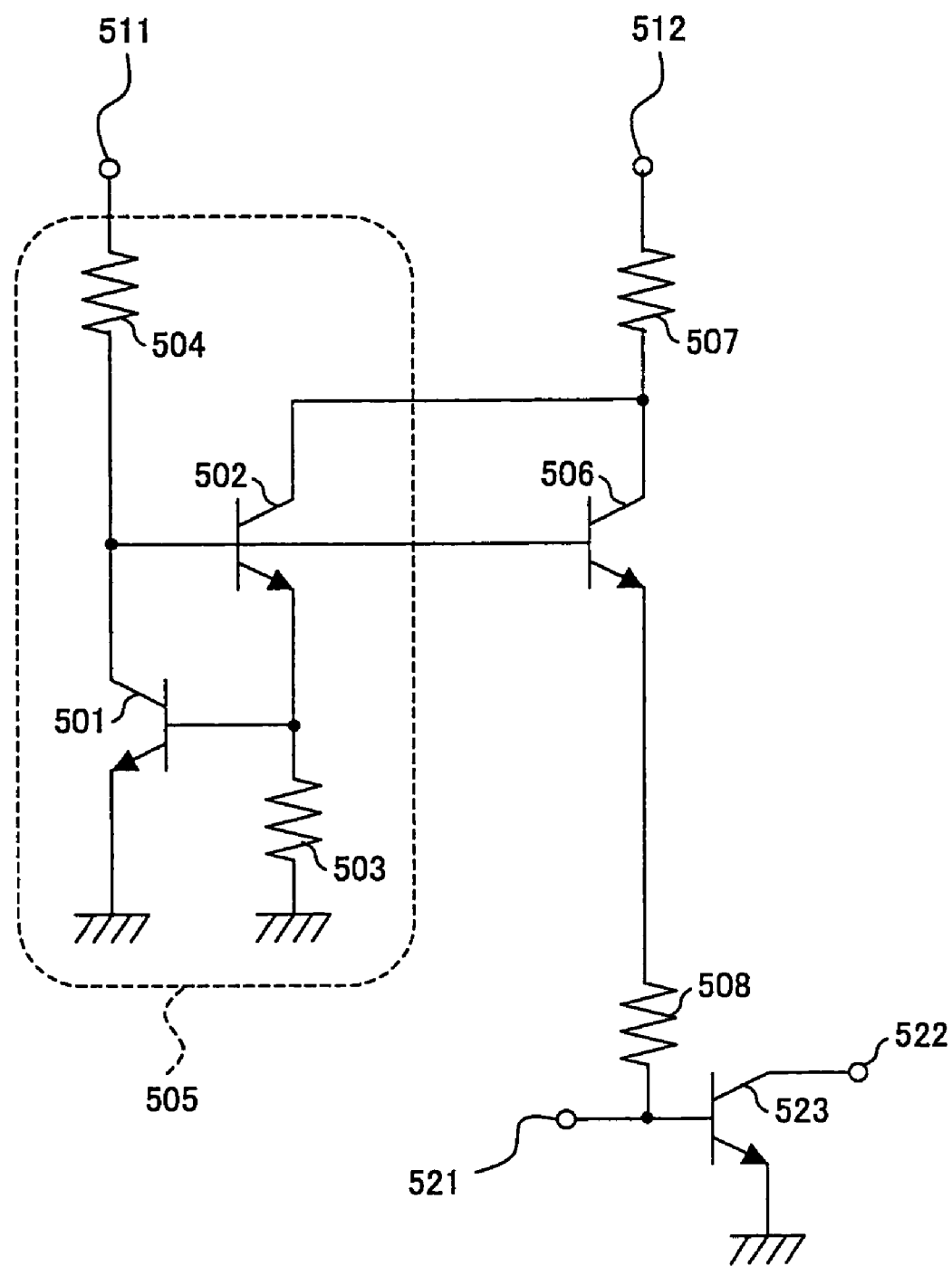
FIG. 8 is a circuit diagram illustrating a configuration of a conventional first bias circuit.
Figure 10:
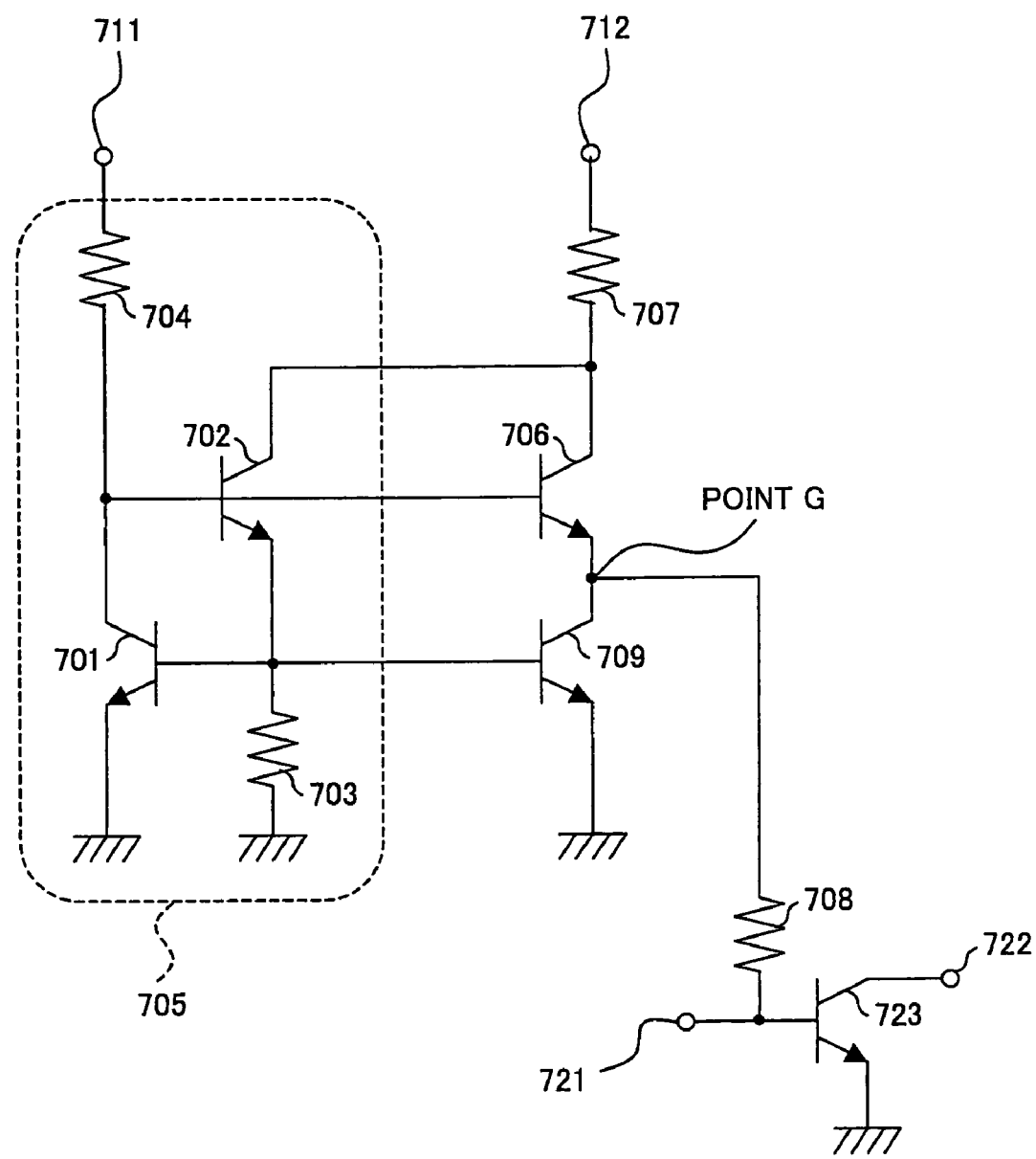
FIG. 10 is a circuit diagram illustrating a configuration of a conventional second bias circuit.

This simulation employed the bias circuit of the present embodiment, and a conventional first bias circuit as in FIG. 8 and a conventional second bias circuit as in FIG. 10 as comparative circuits, so as to show an advantage of the bias circuit of the present embodiment over conventional techniques.

In the simulation, a typical GHz range power InGaP-HBT device was assumed. Transistors having an emitter size of approximately 720 $\mu m^2$ were used as high frequency amplifying transistors (the high frequency amplifying transistors 133, 523, and 723). Transistors having an emitter size of approximately 50 $\mu m^2$ were used as bias transistors other than the high frequency amplifying transistors.

For simplification of the circuit, a plurality of the power supply ports in each circuit were handled in a bundle as one Vbb terminal. Moreover, in the bias circuit of the present embodiment, two adjustment resistors 107 and 117 were also handled in a bundle by replacing the adjustment resistors 107 and 117 with one resistor.

A resistance of each adjustment resistor and resistor in the circuits was adjusted so that an idle current (current at the time when a high frequency signal is not inputted) of a collector terminal of the high frequency amplifying transistor became 20 mA under the condition of 2.8V power supply voltage at a temperature of 25° C.

As a result, in the bias circuit of the present embodiment, the adjustment resistors 104 and 113 had a resistance of 235Ω and the adjustment resistor 114 had a resistance of 20Ω. Moreover, in the circuit, the resistor 103 had a resistance of 1.5 kΩ. In the first bias circuit, the adjustment resistor 504 had a resistance of 380Ω and the resistor 503 had a resistance of 2 kΩ. In the second bias circuit, the adjustment resistor 704 had a resistance of 240Ω and the resistor 703 had a resistance of 0.5 kΩ.

A part of adjustment resistor values largely depend on other factors such as overcurrent protection, prevention of thermal excursion, or distortion compensation. Accordingly, these adjustment resistor values were set to a common fixed value in all the circuits. Namely, the adjustment resistors 507, 707, 118, 508, and 708 were set to a fixed value of 100Ω. Moreover, the resistor replacing the adjustment resistors 107 and 117 for simplification was also set to a resistance of 100Ω.

FIG. 4 is a graph illustrating stability of each of the circuits with respect to a power supply voltage change. The vertical axis of the graph indicates a collector idle current (Icc) of each of the amplifying transistors and the horizontal axis indicates a power supply voltage. The conventional technique 1 indicates Icc of the high frequency amplifying transistor 523 of the first bias circuit and the conventional technique 2 indicates Icc of the high frequency amplifying transistor 723 of the second bias circuit. The present invention indicates Icc of the high frequency amplifying transistor 133 of a bias circuit of the present invention.

In FIG. 4, the smaller a change in Icc is, the higher the stability of the circuit against a power supply voltage change is. Namely, in FIG. 4, the flatter the line graph of Icc is, the higher the stability of the circuit is.

Therefore, according to the graph in FIG. 4, a stability of the bias circuit of the present embodiment is higher in all the power supply voltage range than that of the first bias circuit. Moreover, the stability of the bias circuit of the present embodiment is also higher in a range of high power supply voltages (a range of power supply voltages higher than 2.8V) than that of the second bias circuit.

FIG. 5 is a graph illustrating stability of each circuit with respect to a temperature change. The vertical axis indicates a collector idle current (Icc) of amplifying transistors and the horizontal axis indicates a temperature. The conventional technique 1 indicates Icc of the high frequency amplifying transistor 523 of the first bias circuit and the conventional technique 2 indicates Icc of the high frequency amplifying transistor 723 of the second bias circuit. The present invention indicates Icc of the high frequency amplifying transistor 133 of a bias circuit of the present invention.

In FIG. 5, the smaller a change in Icc is, the higher the stability of the circuit against a temperature change is. Namely, in FIG. 5, the flatter the line graph of Icc is, the higher the stability of the circuit is.

Therefore, according to the graph in FIG. 5, a stability of the bias circuit of the present embodiment is higher in all the temperature range than that of the first bias circuit, and the stability of the bias circuit of the present embodiment is equivalent to that of the second bias circuit.

This means that the bias circuit of the present embodiment can output a bias current that is more stable against a temperature change and/or a power supply voltage change.

Figure 6:
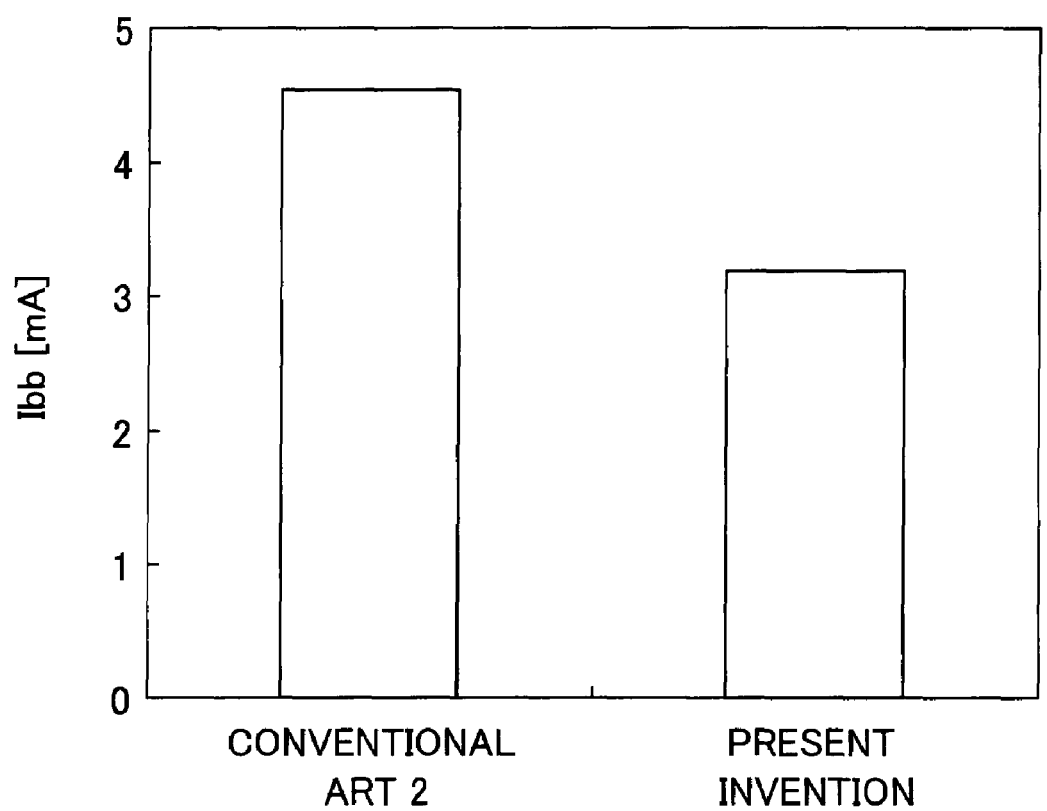
FIG. 6 is a graph illustrating a relationship between a consuming current of the bias circuit and a consuming current of a conventional second bias circuit.

A result of comparison of consuming currents of Vbb terminals under a standard condition (temperature at 25° C., power supply voltage at 2.8V) is illustrated in FIG. 6 to show more advantage of the bias circuit of the present embodiment over the conventional second bias circuit.

FIG. 6 is a graph illustrating a consuming current of the bias circuit of the present embodiment and a consuming current of the conventional second bias circuit. The vertical axis indicates a consuming current (Ibb).

The consuming current can be reduced further by changing a mirror ratio of the current mirror section or reducing a size of a bias transistor. However, for simplification, in the comparison, the second bias circuit as illustrated in FIG. 10 is assumed to be a circuit whose consuming current has not been reduced by such efforts.

The graph as illustrated in FIG. 6 shows that a consuming current of the bias circuit of the present embodiment is smaller than a consuming current of the conventional bias circuit. The reason why the consuming current of the bias circuit of the present embodiment is smaller than the consuming current of the second bias circuit is clear from the circuit structures.

Namely, in the second bias circuit, a transistor having the largest consuming current in the bias circuit is the third transistor 706. The output of the third transistor 706 flows not only into the high frequency amplifying transistor 723 but also into the fourth transistor 709 for bias, and the output is consumed by the both.

On the other hand, in the bias circuit of the present embodiment, a transistor having the largest consuming current in the bias circuit is the fourth transistor 112. The output of the fourth transistor 112 is connected only to the high frequency amplifying transistor 133. Therefore, the output is not unnecessarily used by other element.

Accordingly, the bias circuit of the present invention can further suppress a consuming current.

As mentioned above, the bias circuit of the present invention can suppress a consuming current and output a bias current that is more stable against a temperature change and/or a power supply voltage change.

The bias circuit of the present embodiment includes a circuit block section 105 and utilizes a potential that is stabilized in the circuit block section 105 and taken out by a current mirror. An essential part of the principle of the conventional first and second bias circuits also depends on the publicly known reference power supply circuit 600 as illustrated in FIG. 9.

However, the circuit structure of the bias circuit of the present embodiment has two different points from the circuit structures of the conventional first and second bias circuits.

The first difference is that the bias circuit of the present embodiment takes out a potential from the reference power supply circuit 600 as illustrated in FIG. 9 only at the point I but not at the point H. In a case where the reference power supply circuit 600 is used as a "voltage reference circuit", there are a plurality of possible points for taking out a stable potential. The conventional first bias circuit utilizes a potential at the point H by taking out the potential by a current mirror. The conventional second bias circuit utilizes potentials at both of the points H and I by taking out the potentials by current mirrors. This difference has a significant meaning in a power amplifier in the Embodiment 6 explained later.

The second difference is a point that, in the bias circuit of the present invention, the potential taken out from the reference power supply circuit 600 is not directly supplied to a transistor (the fourth transistor 112 in the present embodiment) which ultimately performs a bias output. This difference is caused by taking in a structure equivalent to a peaking power source structure as illustrated in FIG. 2 which peaking power source structure does not exist at all in the conventional first and second bias circuits. Due to an effect of the peaking current source, the bias circuit of the present embodiment can realize a higher stability with a lower current consumption, compared with the conventional first and second bias circuits.

Embodiment 2

Another embodiment of the present invention is explained below. An arrangement other than an arrangement explained in the present embodiment is the same as an arrangement in the Embodiment 1. For convenience of an explanation, members given the same reference numerals as the members as in drawings of the Embodiment 1 respectively have identical functions and the explanations thereof are omitted.

In an electronic circuit, adjustment resistors are often inserted in the circuit for various purposes. It is obvious that the scope of the present invention includes a circuit in which such an adjustment resistor is added to a bias circuit structure of the Embodiment 1 as illustrated in FIG. 1 as a base, because a fundamental principle of such a circuit is not different from the fundamental principle of the present invention.

Figure 12:
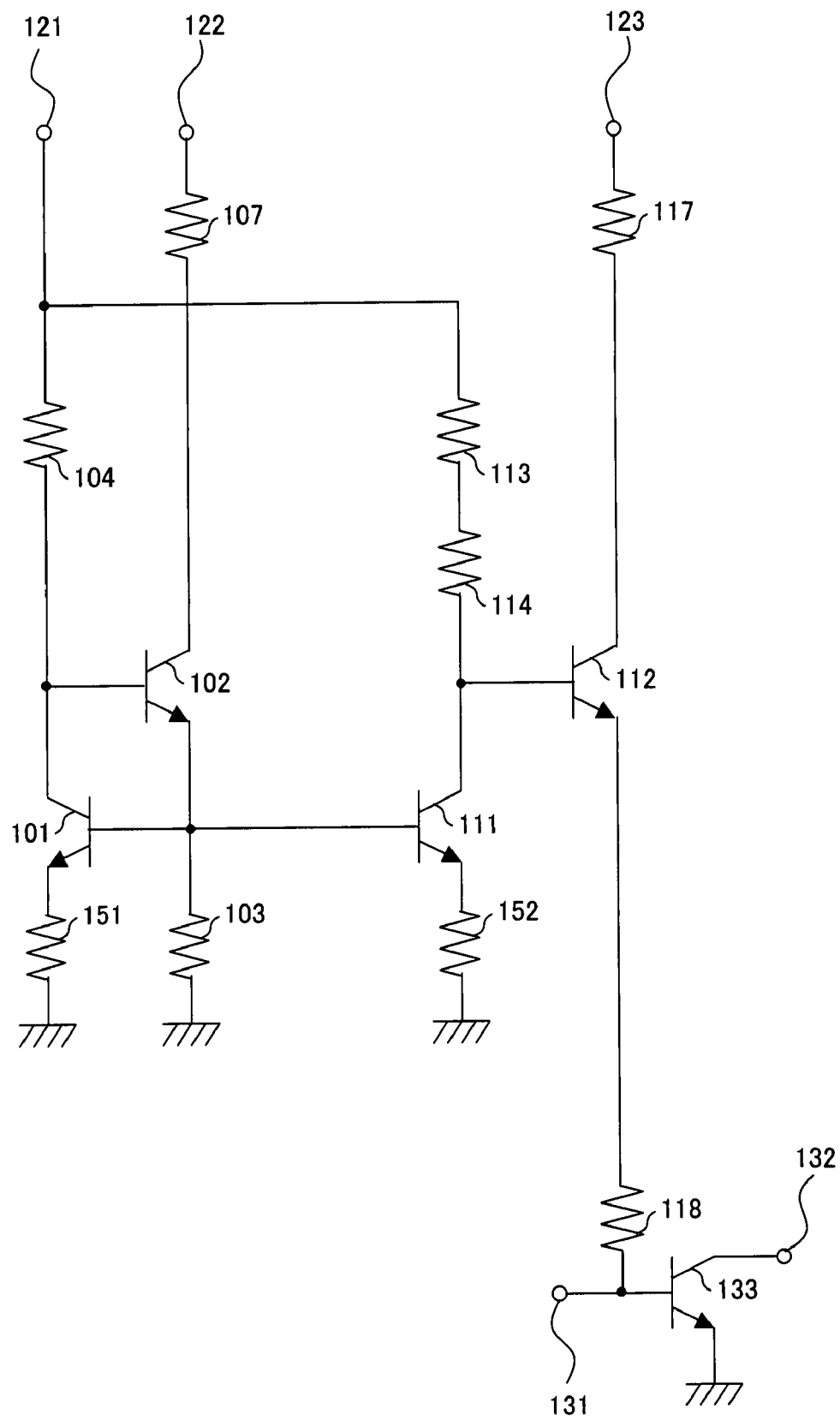
FIG. 12 is a circuit diagram illustrating a second embodiment of a bias circuit of the present invention.

FIG. 12 is a circuit diagram illustrating one example of a circuit configuration of a bias circuit according to the present embodiment.

As illustrated in FIG. 12, the bias circuit of the present embodiment includes adjustment resistors 151 and 152 in addition to a configuration of the bias circuit of the Embodiment 1 as illustrated in FIG. 1. Common reference numerals between FIG. 1 and FIG. 12 are defined for FIG. 12 as set forth for FIG. 1 unless otherwise specified.

The adjustment resistor 151 is inserted between a first transistor 101 and the ground. More specifically, one terminal of the adjustment resistor 151 is connected to an emitter terminal of the first transistor 101 and the other terminal of the adjustment resistor 151 is connected to grounded.

The adjustment resistor 152 is inserted between a third transistor 111 and the ground. More specifically, one terminal of the adjustment resistor 152 is connected to an emitter terminal of the third transistor 111 and the other terminal of the adjustment resistor 152 is grounded.

Here, in the bias circuit of the Embodiment 1 as illustrated in FIG. 1, a base current of the first transistor 101 largely depends on a base/emitter threshold voltage (common name: VBE) in the first transistor 101 itself. Therefore, if the VBE changes, for example, by 1% due to production tolerance, a base current of the first transistor 101 is influenced by the full 1% change.

However, in the bias circuit of the present Embodiment as illustrated in FIG. 12, a base current of the first transistor 101 is influenced by a voltage that the adjustment resistor 151 generates in addition to the VBE in the first transistor 101 itself. Therefore, even if the VBE changes, for example, by 1% due to production tolerance, a base current of the first transistor 101 is influenced by less than the 1% change.

Accordingly, in the bias circuit of the present embodiment, the provision of the adjustment resistor 151 suppresses an influence of the production tolerance. Moreover, in the third transistor 111, the provision of the adjustment resistor 152 produces the same effect as in the first transistor 101 and prevents an influence of the production tolerance.

In this way, in the present invention, adjustment resistors may be added to a circuit configuration as illustrated in FIG. 1 as a base. Particularly, an addition of the adjustment resistors 151 and 152, as illustrated in FIG. 12, is effective in reducing the influence of the production tolerance.

Embodiment 3

Another embodiment of the present invention is explained below. An arrangement other than an arrangement explained in the present embodiment is the same as arrangements in the Embodiments 1 and 2. For convenience of an explanation, members given the same reference numerals as the members as in drawings of the Embodiments 1 and 2 respectively have identical functions and the explanations thereof are omitted.

A recent power amplifier using a bipolar transistor often adopts a design technique in which a distortion compensation circuit is added to a part of a bias circuit for the purpose of improving linearity. A circuit configuration of a circuit of the Embodiment 1 as illustrated in FIG. 1 can co-exist with some of distortion compensation circuits. It is obvious that the scope of the present invention includes such a circuit in which the bias circuit and the distortion compensation circuits co-exist.

Figure 13:
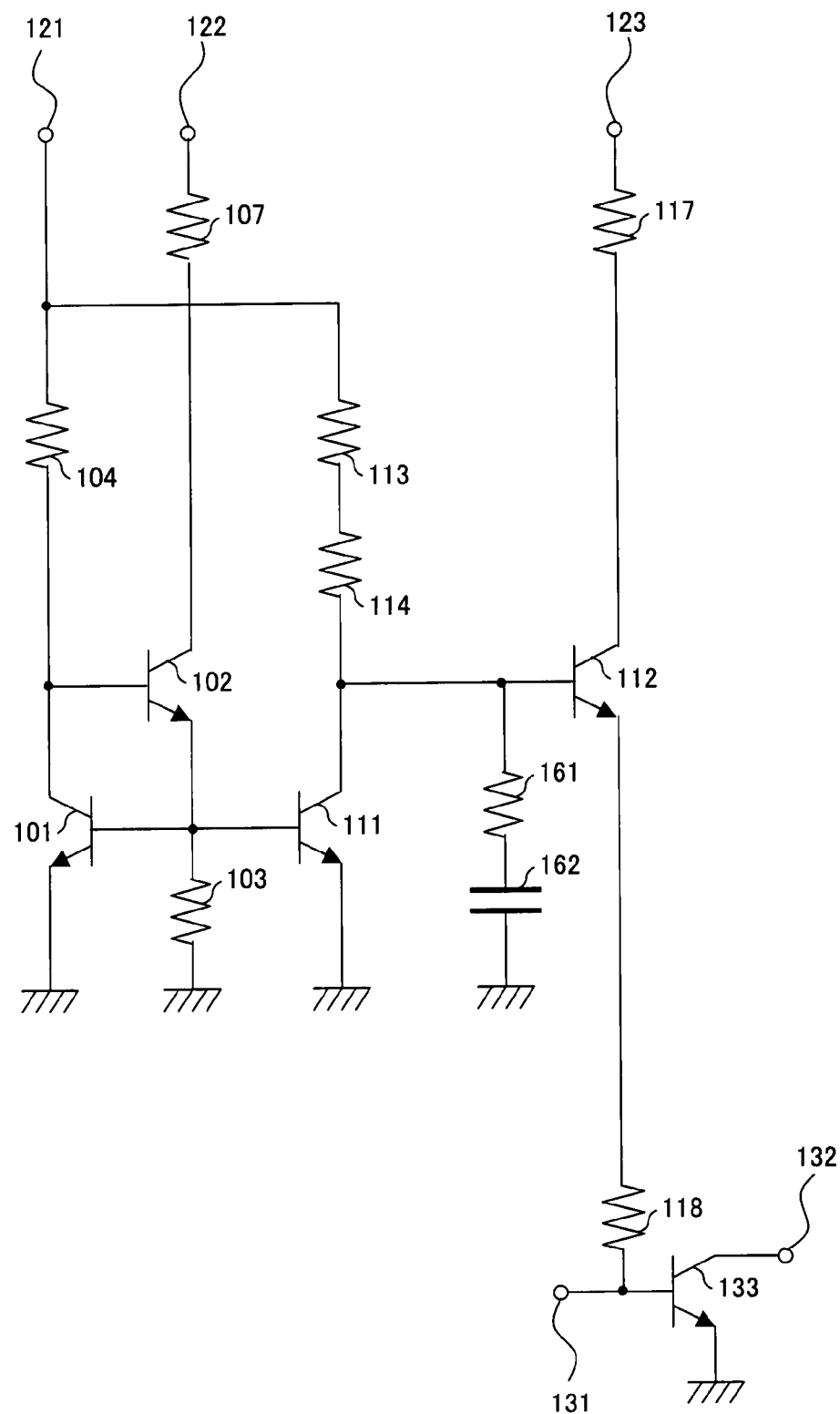
FIG. 13 is a circuit diagram illustrating a third embodiment of a bias circuit of the present invention.

FIG. 13 is a circuit diagram illustrating one example of a bias circuit of the present embodiment.

As illustrated in FIG. 13, a bias circuit of the present embodiment includes a resistor 161 and a distortion compensation capacitor 162 in addition to a configuration of the bias circuit of the Embodiment 1 as illustrated in FIG. 1. The resistor 161 and the distortion compensation capacitor 162 constitute a distortion compensation circuit. Common reference numerals between FIG. 1 and FIG. 13 are defined for FIG. 13 as set forth for FIG. 1 unless otherwise specified.

The resistor 161 and the distortion compensation capacitor 162 are connected in series. More specifically, one terminal of the distortion compensation capacitor 162 is connected to a base terminal of a fourth transistor 112 via the resistor 161 and the other terminal is grounded.

This makes it possible to independently adjust each of a reactance component and a resistance component of the bias circuit, when the components are viewed on a side provided with the fourth transistor 112 from the base terminal of the high frequency amplifying transistor 133. Therefore, an output current for which a distortion compensation effect is strengthened can be supplied to the base terminal of the high frequency amplifying transistor 133. Accordingly, it is possible to reduce a distortion in a high frequency signal that is outputted from an output port 132 and improve linearity of the high frequency signal.

In this way, according to the present invention, a distortion compensation capacitor may be added to the circuit configuration as illustrated in FIG. 1 as a base. A design technique of adding a distortion compensation circuit, as in the bias circuit of the present embodiment, is described in, for example, the Publicly Known Document 1 mentioned above. In other words, a variable impedance element as described in the Publicly Known Document 1 corresponds to the fourth transistor 112 in the bias circuit of the present Embodiment.

The purpose of the resistor 161 and the distortion compensation capacitor 162 is to finely adjust distortion characteristics of the high frequency amplifying transistor 133 by being used together. Accordingly, depending on characteristics of the high frequency amplifying transistor 133, either one of a resistance of the resistor 161 and a capacitance of the distortion compensation capacitor 162 may be zero. In other words, the distortion compensation circuit may be constituted by either one of the resistor 161 and the distortion compensation capacitor 162. However, it is not preferable to have no distortion compensation capacitor 162 in the distortion compensation circuit because, without the distortion compensation capacitor 162, direct current loss occurs via the resistance 161 with respect to the ground.

Embodiment 4

Another embodiment of the present invention is explained below. An arrangement other than an arrangement explained in the present embodiment is the same as arrangements in the Embodiments 1 through 3. For convenience of an explanation, members given the same reference numerals as the members as in drawings of the Embodiments 1 through 3 respectively have identical functions and the explanations thereof are omitted.

There is increasing demands for including a function of switching bias points of an amplifying transistor in a power amplifier including a recent bias circuit. For example, in a case where a short distance wireless communication is carried out, the function switches to a "low power consumption mode" and suppresses power consumption by taking a shallow bias point, sacrificing a linear output. On the other hand, in a case where a long distance wireless communication is carried out, the function switches to a "high output mode" and enhances the linear output by taking a deep bias point, sacrificing power consumption.

The bias circuit of the present invention has a circuit structure in which such switching of the bias points is easily performed for the following reason. For example, in each bias circuit of the Embodiments 1 through 3, a base terminal of a first transistor 101 and a base terminal of a third transistor 111 are directly connected to a resistor 103. Moreover, a base terminal of a second transistor 102 is directly connected to a collector terminal of the first transistor 101. Accordingly, base potentials of all transistors in the bias circuit are changed by changing a resistance of the resistor 103.

Figure 14:
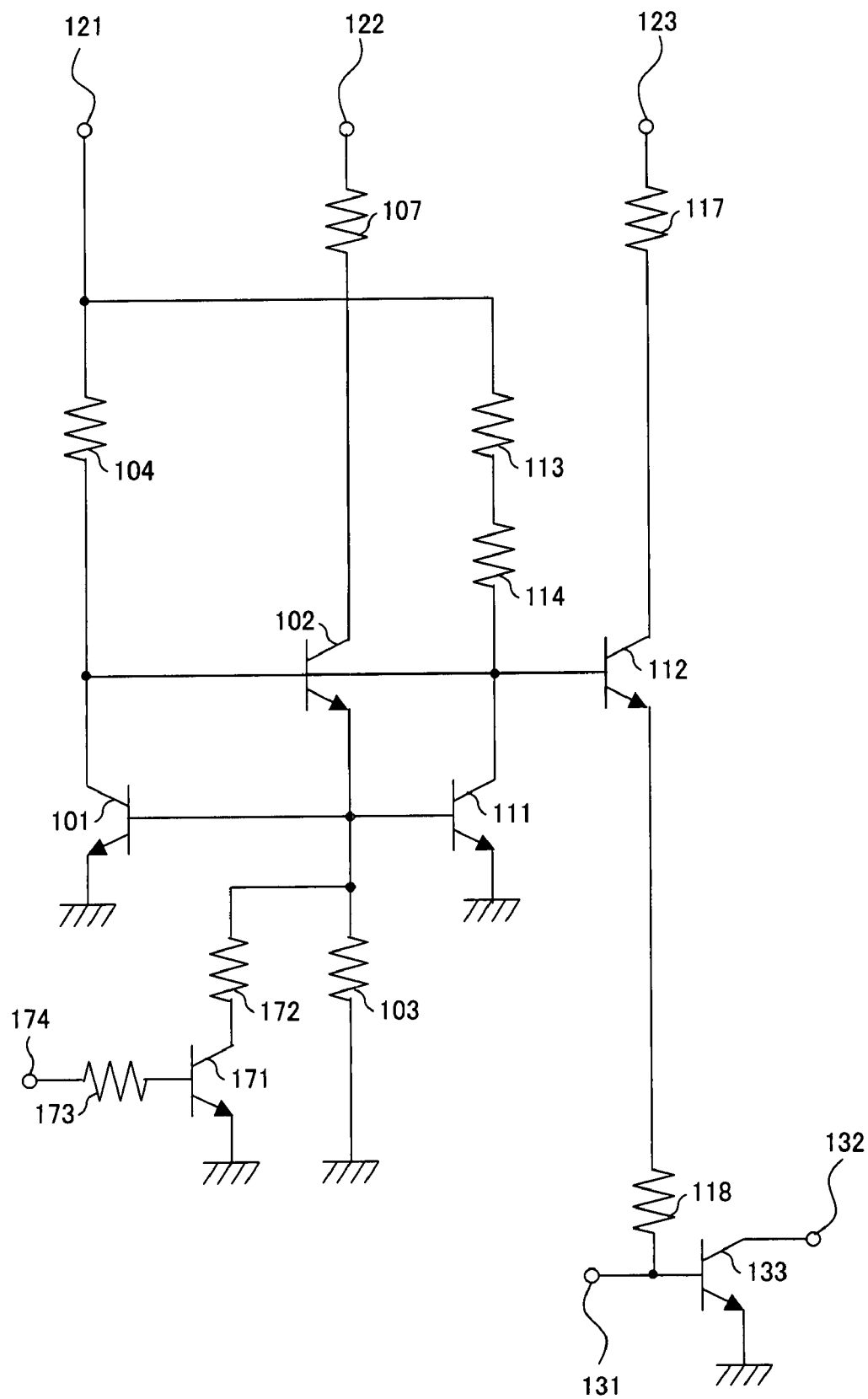
FIG. 14 is a circuit diagram illustrating a fourth embodiment of a bias circuit of the present invention.

FIG. 14 is a circuit diagram illustrating one example of a configuration of a bias circuit of the present embodiment.

The bias circuit of the present embodiment is one example of a configuration in which addition of the function of switching bias points is realized by a minimum-scale circuit. As illustrated in FIG. 14, the bias circuit of the present embodiment includes a sixth transistor 171, a resistor 172, a protective resistor 173, and a control terminal 174 in addition to a configuration of a bias circuit of the Embodiment 1 as illustrated in FIG. 1. Common reference numerals between FIG. 1 and FIG. 14 are defined for FIG. 14 as set forth for FIG. 1 unless otherwise specified. Note that, in the bias circuit of the present embodiment as illustrated in FIG. 14, a base terminal of a fourth transistor 112 is connected also to a collector terminal of a first transistor 101.

A collector terminal of the sixth transistor 171 is connected, via the resistor 172, to a terminal of a resistor 103 which terminal is opposite to a terminal grounded. A base terminal of the sixth transistor 171 is connected to a control terminal 174 via the protective resistor 173, and an emitter terminal is grounded. Namely, a series circuit composed of the resistor 172 and the sixth transistor 171 is connected in parallel to the resistor 103.

In the bias circuit of the present embodiment having the above configuration, when a low voltage signal is provided from the control terminal 174, the sixth transistor 171 is turned off. Accordingly, the resistor 172 becomes ineffective. Accordingly, only the resistor 103 decides base potentials of all the transistors in the bias circuit. A substantial resistance of the resistor 103 does not change.

On the contrary, when a high voltage signal is provided from the control terminal 174, the sixth transistor 171 is turned on. Accordingly, the resistor 172 becomes effective. Namely, because the bias circuit goes in a state in which the resistors 172 and 103 are inserted in parallel, a substantial resistance of the resistor 103 appears to be decreased.

As a result, a resistance of the resistor 103 can be varied by providing a high or low voltage signal from the control terminal 174. Accordingly, in the bias circuit of the present embodiment, switching of bias points can be easily performed by varying a resistance of the resistor 103. In other words, it becomes possible to realize a bias circuit including a function of switching bias points.

Figure 7:
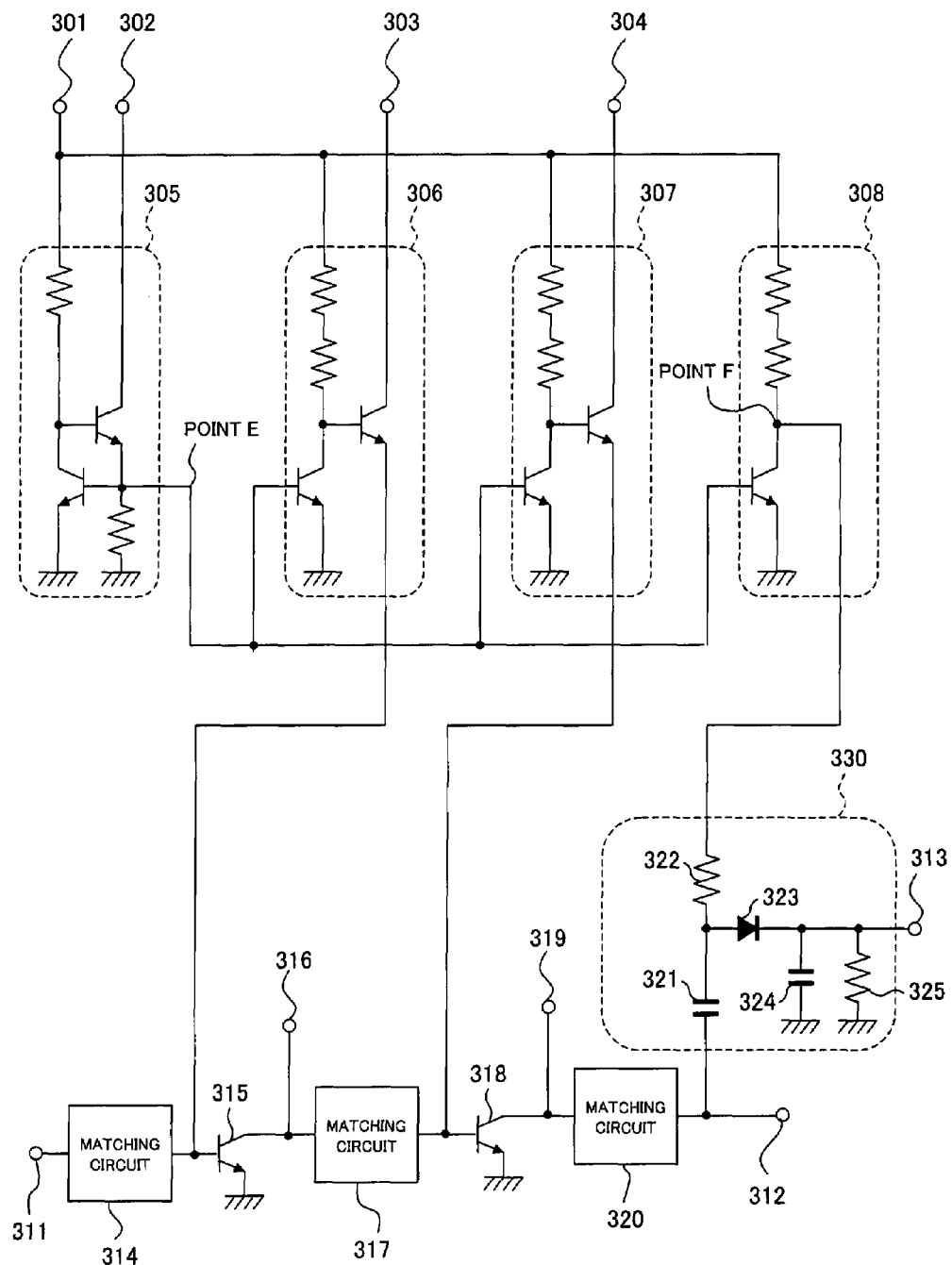
FIG. 7 is a circuit diagram illustrating one embodiment of a power amplifier of the present invention.

The bias circuit of the present embodiment has a feature such that the circuit structure is suitable for switching the bias points. This feature becomes particularly prominent and effective in a case of a multistage power amplifier as explained later in Embodiment 6 with reference to FIG. 7 for the following reason. Namely, if a modification to make a resistance of the resistor 103 as illustrated in FIG. 14 become variable is applied to only one point in a common section (bias circuit section 305) as illustrated in FIG. 7, bias points of all the stages can be switched altogether. Moreover, this feature has a significant effect in shrinking a circuit scale.

Embodiment 5

Another embodiment of the present invention is explained below. An arrangement other than an arrangement explained in the present embodiment is the same as arrangements in the Embodiments 1 through 4. For convenience of an explanation, members given the same reference numerals as the members as in drawings of the Embodiments 1 through 4 respectively have identical functions and the explanations thereof are omitted.

In the Embodiment 1, in the case of a GaAs-HBT power amplifier that is assumed to include a bias circuit, a bias circuit like a current reference circuit is suitable as a bias circuit for supplying a bias to a base terminal of a high frequency amplifying transistor.

Figure 11:
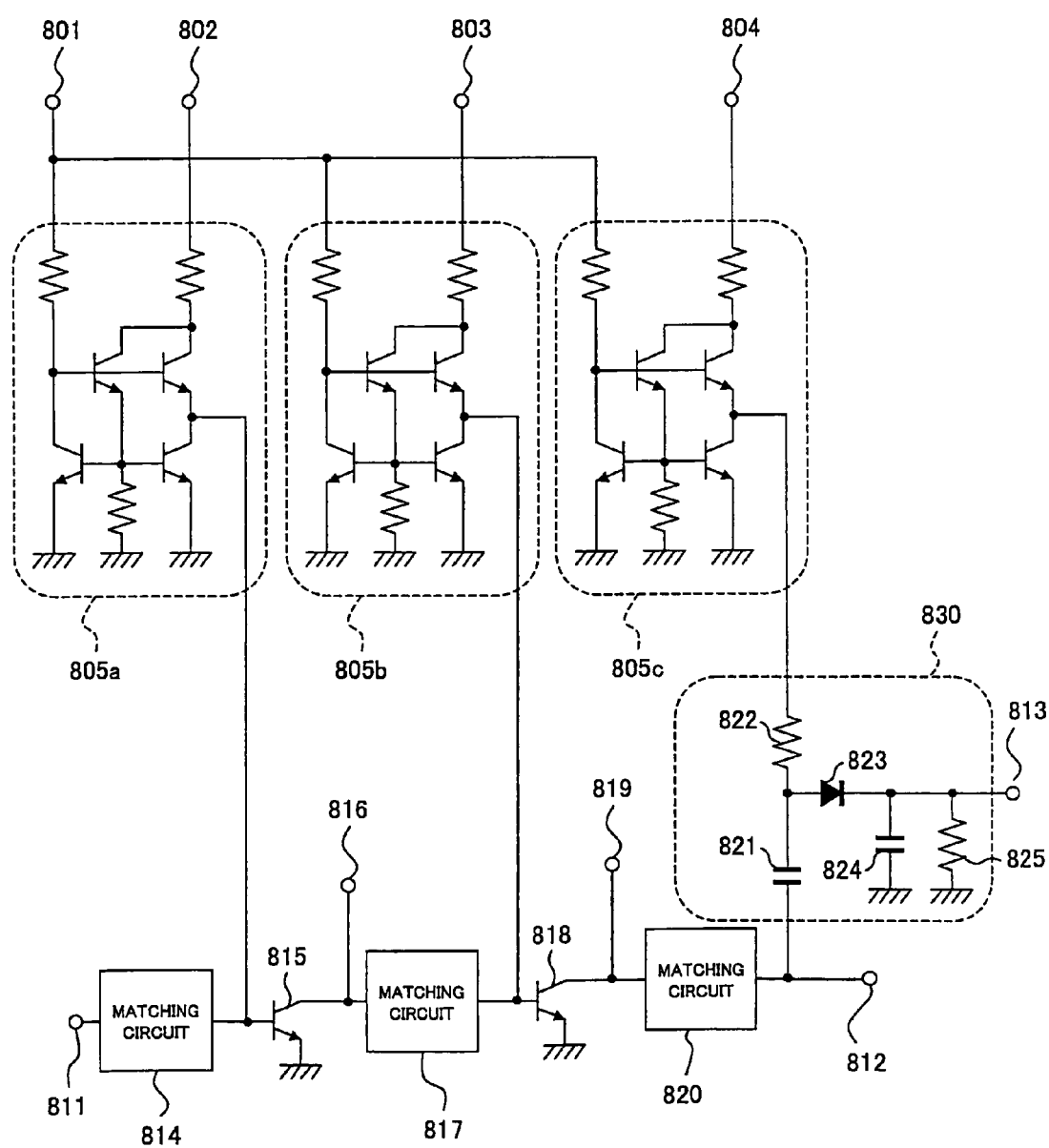
FIG. 11 is a circuit diagram illustrating a configuration of a conventional power amplifier.

However, for example, in the case of a diode-type power sensor circuit as in FIG. 11, a bias circuit like a voltage reference circuit is rather suitable. The bias circuit of the embodiment 1 can also be applied in a case where the bias circuit is used as a bias circuit like a voltage reference circuit.

A bias circuit of the present Embodiment is constituted as a bias circuit like a voltage reference circuit. More specifically, the bias circuit of the present embodiment includes a configuration in which all of a fourth transistor 112, and an adjustment resistor 117 and a third power supply port 123 that accompanies the fourth transistor 112 are removed from the bias circuit of the Embodiment 1. In the bias circuit of the present embodiment, a potential at the point C is directly taken out and used an output voltage.

Namely, the bias circuit of the present embodiment may be composed of a circuit block section 105, an adjustment resistor 107, and a second circuit section 116. It is clear that the above arrangement also includes a peaking voltage source.

Moreover, in the bias circuit of the present embodiment, no current flows into other element and is unnecessarily consumed, because a potential is directly taken out from a collector terminal of the third transistor.

Accordingly, The bias circuit of the present embodiment can suppress a consuming current and output a bias voltage that is more stable against a temperature change and/or a power supply voltage change.

Therefore, it is clear that the second circuit section 116 of the bias circuit of the Embodiment 1 individually functions as a potential generating circuit, and a current generating circuit 115 of a bias circuit of the Embodiment 1 individually functions as a current generating circuit.

One example of the bias circuit of the present embodiment is employed as a bias circuit 308 for a power sensor 330, in the Embodiment 6 explained next.

Embodiment 6

Another embodiment of the present invention is explained below. An arrangement other than an arrangement explained in the present embodiment is the same as arrangements in the Embodiments 1 through 5. For convenience of an explanation, members given the same reference numerals as the members as in drawings of the Embodiments 1 through 5 respectively have identical functions and the explanations thereof are omitted.

FIG. 7 is a circuit diagram illustrating one example of a power amplifier of the present embodiment.

A power amplifier of the present embodiment is a two-stage amplifier with a power sensor 330. The power amplifier of the present embodiment amplifies a high frequency signal in two stages with high frequency amplifying transistors 315 and 318. A section composed of bias circuit sections 305 through 308 is a bias circuit for the two-stage amplifier.

The power amplifier of the present embodiment has the same configuration as a conventional amplifier explained in the background of the invention except sections composed of bias circuit sections 805a through 805c. Namely, component members given reference numerals 311 through 325 in FIG. 7 correspond to component members given reference numerals 811 through 825 in FIG. 11, respectively.

In the conventional power amplifier as illustrated in FIG. 11, three bias circuits 805a through 805c are independently connected to three circuits (high frequency amplifying transistors 815 and 818, and a power sensor 830) that require bias supply.

In the three bias circuits 805a through 805c as a whole, 12 transistors are used in total. Because it is difficult to compare actual areas occupied by circuit layouts in this specification, the number of transistors employed is used as a basis for comparing sizes of circuit scales, for convenience.

On the other hand, the power amplifier of the present embodiment includes the bias circuit sections 305 through 308 as illustrated in FIG. 7.

The bias circuit section 305 has the same configuration as a circuit block section 105 as illustrated in FIG. 1. Moreover, the bias circuit section 305 receives power supply from a first power supply port 301 and a second power supply port 302. An output of the bias circuit section 305 is connected to the bias circuit sections 306 through 308. A point E corresponds to a point D in FIG. 1.

The bias circuit section 306 has the same configuration as a circuit generating circuit 115 as illustrated in FIG. 1. Moreover, the bias circuit section 306 receives power supply from the first power supply port 301 and a third power supply port 303. An output of the bias circuit section 306 is connected to a base terminal of the high frequency amplifying transistor 315.

Accordingly, it is clear that a configuration including the bias circuit sections 305 and 306, independently, are the same as a configuration including the circuit block section 105 and the current generating circuit 115. Therefore, it is clear that the configuration of the bias circuit sections 305 and 306 includes a circuit equivalent to a peaking current source.

The bias circuit section 307 has the same configuration as the bias circuit section 306, i.e., the current generating circuit 115 as illustrated in FIG. 1. The bias circuit section 307 receives power supply from the first power supply port 301 and the fourth power supply port 304. An output of the bias circuit section 307 is connected to a base terminal of the high frequency amplifying transistor 318. Therefore, in view of only the configuration including the bias circuit sections 305 and 307, it is clear that the configuration of the bias circuit sections 305 and 307 also includes a circuit equivalent to a peaking current source.

The bias circuit section 308 has the same configuration as the second circuit section 116 as illustrated in FIG. 1. The bias circuit section 308 receives power supply from the first power supply port 301. An output of the bias circuit 308 is connected to the power sensor 330. Therefore, in view of a configuration including the bias circuit sections 305 and 308, it is clear that the configuration of the circuit sections 305 and 308 includes a circuit equivalent to a peaking voltage source.

As mentioned above, in the power amplifier of the present embodiment, the bias circuits connected to the three circuits (the frequency transistors 315 and 318, and the power sensor 330) that require bias supply are not completely independent from each other. The bias circuits are composed of the bias circuit sections 306 through 308 sharing the bias circuit section 305.

In other words, in the power amplifier of the present invention, the bias circuit, i.e. the circuit block section 105 is shared and two bias circuits of the Embodiment 1 and one bias circuit of the Embodiment 5 are included.

Therefore, as a result of sharing a part of the circuit, in the bias circuit as a whole, the number of the transistors is reduced to 8. Namely, a circuit scale is reduced with respect to a conventional power amplifier.

In the power amplifier of the present embodiment, the bias circuit section 305 can be shared. With regard to this share, explained below is a reason why it is easy to share the bias circuit section 305 in the power amplifier of the present embodiment whereas it is difficult in a conventional power amplifier.

In the conventional first bias circuit and the conventional second bias circuit, as explained above, a point H in FIG. 9 is used as a position at which a stable direct current potential is taken out from a reference power supply circuit.

However, the conventional first and second bias circuits have circuit structures in which a high frequency signal leaks to the point H. This leakage occurs due to imperfect base/emitter isolations of the transistors (the third transistor 506 of the conventional first bias circuit and the third transistor 706 of the second bias circuit) connected to the point H.

If a reference power supply circuit (i.e. the circuit block section 505 and the circuit block section 705) is shard via the point H to which a high frequency signal leaks as mentioned above, for example, the conventional power amplifier may have a risk such that the conventional power amplifier oscillates due to a positive feedback from a second stage amplifier (high frequency transistor 818) to a first stage amplifier (high frequency transistor 815). Therefore, in the conventional first and second bias circuits, it is difficult to share the circuit block sections 505 and 705.

On the other hand, in the power amplifier of the present embodiment, as explained above, only the point I in FIG. 9 is used as a point at which a stable direct current potential is taken out from the reference power supply circuit.

The point I in FIG. 9 corresponds to the point D in FIG. 1. Before a high frequency signal to pass through the high frequency amplifying transistor 133 leaks and arrives at the point D, the high frequency signal is attenuated by two stages, i.e., base/emitter isolations of the fourth transistor 112 and the third transistor 111.

Accordingly, a high frequency signal that leaks barely arrives at the point D. Therefore, in the power amplifier of the present embodiment, even if the bias circuit section 305 is shared, a problem such as an unwanted oscillation does not occur.

Therefore, in the power amplifier of the present embodiment, the bias circuit section 305 can be shared. This makes it possible to reduce a circuit scale. Moreover, the power amplifier of the present embodiment can suppress a consuming current and output a bias circuit and a bias voltage that are more stable against a temperature change and/or a power supply voltage change, including the bias circuits of the Embodiment 1 and the Embodiment 5.

Although the power amplifier is explained above as a two-stage amplifier with the power sensor 330, the power amplifier is not limited to this. The power amplifier may be an N-stage amplifier according to a design or others such as a ground amplifier circuit or a mixer circuit.

The present invention is not limited to the description of the embodiments above, but may be altered by a skilled person within the scope of the claims. An embodiment based on a proper combination of technical means disclosed in different embodiments is encompassed in the technical scope of the present invention.

The present invention is particularly effective in realization of (i) a bias circuit that outputs a bias current and a bias voltage that is more stable against a temperature change and/or a power supply voltage change and (ii) a power amplifier including the bias circuit. The present embodiment is preferably applied to a communication apparatus that mounts a wireless communication system adopting an advanced modulation system.

As mentioned above, a bias circuit of the present invention includes: a first transistor having an emitter terminal grounded, a base terminal grounded via a first resistor, and a collector terminal connected to a first power supply port via a second resistor; a second transistor having an emitter terminal connected to the base terminal of the first transistor, a base terminal connected to the collector terminal of the first transistor, and a collector terminal provided with power from a second power supply port; a third transistor having an emitter terminal grounded, a base terminal connected to the base terminal of the first transistor, and a collector terminal connected to the first power supply port via a third resistor; and a fourth transistor having a base terminal connected to the collector terminal of the third transistor, and a collector terminal provided with power from a third power supply port, a current being taken out from the emitter terminal of the fourth transistor.

Accordingly, the bias circuit of the present invention includes both of (i) a circuit that forms a potential point whose dependency on a power supply voltage is low and (ii) a circuit that carries out an operation equivalent and similar to that of a peaking current source. This makes it possible to increase the stability against a power supply voltage change by both of the two circuit characteristics. Moreover, because a current is taken out from the emitter terminal of the fourth transistor, all the output of the fourth transistor is used as a bias current and no other element unnecessarily consumes the output. Therefore, the bias circuit of the present invention becomes capable of suppressing a consuming current and outputting a bias current that is more stable against a temperature change and/or a power supply voltage change.

A bias circuit of the present invention includes: a first transistor having an emitter terminal grounded, a base terminal grounded via a first resistor, and a collector terminal connected to a first power supply port via a second resistor; a second transistor having an emitter terminal connected to the base terminal of the first transistor, a base terminal connected to the collector terminal of the first transistor, and a collector terminal provided with power from a second power supply port; and a third transistor having an emitter terminal grounded, a base terminal connected to the base terminal of the first transistor, and a collector terminal connected to the first power supply port via a third resistor, a potential being taken out from the collector terminal of the third transistor.

Accordingly, the bias circuit of the present invention includes both of (i) a circuit that forms a potential point whose dependency on a power supply voltage is low and (ii) a circuit that carries out an operation equivalent and similar to that of a peaking voltage source. This makes it possible to increase the stability against a power supply voltage change by both of the two circuit characteristics. Moreover, because a potential is taken out from the collector terminal of the third transistor, no current flows into other element and unnecessarily consumed. Therefore, the bias circuit of the present invention becomes capable of suppressing a consuming current and outputting a bias voltage that is more stable against a temperature change and/or a power supply voltage change.

In the bias circuit mentioned above, it is preferable that: at least one of the emitter terminal of the first transistor and the emitter terminal of the third transistor is grounded via an adjustment resistor.

According to the arrangement, because the emitter terminal is grounded via the adjustment resistor, it becomes possible to reduce an influence of a base/emitter threshold voltage in the transistor itself on a base current which threshold voltage varies due to production tolerance. This makes it possible to reduce an influence of the production tolerance of the bias circuit of the present invention.

It is preferable that the bias circuit of the present invention further includes: a distortion compensation circuit having one terminal connected to the base terminal of the fourth transistor and the other terminal grounded, the distortion compensation circuit being composed of a distortion compensation capacitor, a resistor, or a circuit in which a distortion compensation capacitor and a resistor are connected in series.

Because the above arrangement includes the distortion compensation circuit, it becomes possible to independently adjust each of a reactance component and a resistance component of the bias circuit, when the components are viewed on a side provided with bias circuit from the emitter terminal of the fourth transistor. Therefore, an output current for which a distortion compensation effect is strengthened can be taken out from the emitter terminal of the fourth transistor.

As mentioned above, an power amplifier of the present invention includes: a plurality of amplifying transistors; and bias circuits which supply output currents to base terminals of the plurality of amplifying transistors, respectively, each of the bias circuits including: a first transistor having an emitter terminal grounded, a base terminal grounded via a first resistor, and a collector terminal connected to a first power supply port via a second resistor; a second transistor having an emitter terminal connected to the base terminal of the first transistor, a base terminal connected to the collector terminal of the first transistor, and a collector terminal provided with power from a second power supply port; and a plurality of current generating circuits each including (i) a third transistor having an emitter terminal grounded, a base terminal connected to the base terminal of the first transistor, and a collector terminal connected to the first power supply port via a third resistor and (ii) a fourth transistor having a base terminal connected to the collector terminal of the third transistor, and a collector terminal provided with power from a third power supply port, the plurality of current generating circuits each being provided in a pair with corresponding one of the plurality of amplifying transistors, an output current being supplied from the emitter terminal of the fourth transistor in each of the plurality of current generating circuits to corresponding one of the base terminals of the plurality of amplifying transistors, the plurality of amplifying transistors each being provided in a pair with corresponding one of the plurality of current generating circuits.

Accordingly, the bias circuit of the present invention includes both of (i) a circuit that forms a potential point whose dependency on a power supply voltage is low and (ii) a circuit that carries out an operation equivalent and similar to that of a peaking current source. This makes it possible to increase the stability against a power supply voltage change by both of the two circuit characteristics. Moreover, an output current is supplied from the emitter terminal of the fourth transistor in each of the plurality of current generating circuits to each of the base terminals of the plurality of amplifying transistors each of which plurality of amplifying transistors is provided in a pair with the corresponding one of the plurality of current generating circuits. Accordingly, all the output of the fourth transistor is used as a bias current and no other element unnecessarily consumes the output. Therefore, the power amplifier of the present invention becomes capable of suppressing a consuming current and outputting a bias current that is more stable against a temperature change and/or a power supply voltage change.

The third transistor in each of the plurality of current generating circuits has the base terminal connected to the base terminal of the first transistor in common and the collector terminal connected to the first power supply port in common via the third resistor. Therefore, each of the plurality of current generating circuits can include a circuit equivalent to a peaking current source, by sharing a circuit section in which the first transistor and the second resistor are connected. Therefore, the power amplifier of the present invention does not need a circuit composed of the first transistor, the second transistor, the first resistor, and the second resistor, in each of the plurality of current generating circuits. This makes it possible to reduce a circuit scale.

It is preferable that the power amplifier further includes: a power sensor; and a potential generating circuit including a fifth transistor having an emitter terminal grounded, a base terminal connected to the base terminal of the first transistor, and a collector terminal connected to the first power supply port via a fourth resistor, an output voltage being supplied to the power sensor from the collector terminal of the fifth transistor in the potential generating circuit.

According to the arrangement mentioned above, an output voltage is supplied to the power sensor from the collector terminal of the fifth transistor of the potential generating circuit. This makes it possible to further include a bias circuit like a voltage reference circuit as well as a bias circuit like a current reference circuit in the arrangement.

In the power amplifier of the present invention, it is preferable that: at least one of the emitter terminal of the first transistor and the emitter terminal of the third transistor in each of the plurality of current generating circuits is grounded via an adjustment resistor.

According to the arrangement, because the emitter terminal is grounded via the adjustment resistor, it becomes possible to reduce an influence of a base/emitter threshold voltage in the transistor itself on a base current which threshold voltage varies due to production tolerance. This makes it possible to reduce an influence of the production tolerance of the power amplifier of the present invention.

It is preferable that the power amplifier of the present invention further includes: a distortion compensation circuit provided in each of the plurality of current generating circuits, the distortion compensation circuit having one terminal connected to the base terminal of the fourth transistor and the other terminal grounded, the distortion compensation circuit being composed of a distortion compensation capacitor, a resistor, or a circuit in which a distortion compensation capacitor and a resistor are connected in series.

Because the above arrangement includes the distortion compensation circuit, it becomes possible to independently adjust each of a reactance component and a resistance component in a signal from the bias circuit to the emitter terminal of the fourth transistor. Therefore, an output current for which a distortion compensation effect is strengthened can be supplied to the base terminal of the amplifying transistor. This makes it possible to reduce a distortion of a high frequency signal outputted from the amplifying transistor and improve linearity.

It is preferable that the bias circuit of the present invention further includes: a series circuit composed of a fifth resistor and a sixth transistor, the series circuit being connected in parallel with the first resistor, the sixth transistor having a base terminal connected to a control terminal via a sixth resistor.

It is preferable that the power amplifier of the present invention further includes: a series circuit composed of a fifth resistor and a sixth transistor, the series circuit being connected in parallel with the first resistor, the sixth transistor having a base terminal connected to a control terminal via a sixth resistor.

There is increasing demands for including a function of switching bias points in a power amplifier including a recent bias circuit. The function of switching bias points indicates a mode switching function by which, for example, a "low power consumption mode" and a "high output mode" are switched. In the "low power consumption mode", power consumption is suppressed by taking a shallow bias point of the transistor even if a linear output is sacrificed. On the other hand, in the "high output mode", the maximum output power is increased by taking a deep bias point of the transistor even if a consuming current is sacrificed.

The bias circuit and the power amplifier of the present invention are capable of realizing a bias circuit and a power amplifier that have the function of switching the bias points. Namely, according to the arrangement, in accordance with a low or high voltage signal provided from the control terminal, the sixth transistor is switched on or off. This switches effectiveness/ineffectiveness of an influence of the fifth resistor on a resistance of the first resistor. Accordingly, the resistance of the first transistor becomes variable. As a result, the bias points can be easily switched by merely providing a low or high voltage signal form the control terminal. Therefore, it becomes possible to realize a bias circuit and a power amplifier having the function of switching the bias points.

Namely, the bias circuit and the power amplifier of the present invention have a circuit structure capable of carrying out a performance of switching the bias points by varying the resistance of the first transistor. This is because the base terminal of the first transistor and the base terminal of the third transistor are directly connected to the first resistor, and the base terminal of the second transistor is directly connected to the collector terminal of the first transistor. Therefore, all base potentials of all the transistors in the bias circuit vary according to a variation in a resistance of the first transistor.

In one preferable embodiment of the present invention, a series circuit composed of the fifth resistor and the sixth transistor are connected in parallel to the first resistor and the base terminal of the sixth transistor is connected to the control terminal via the sixth resistor, so that a resistance of the first resistor becomes variable.

In the above arrangement, when a low voltage signal is provided from the control terminal, the sixth transistor is turned off and a substantial resistance of the first resistor does not change. On the contrary, when a high voltage signal is provided from the control terminal, the sixth transistor is turned on. Consequently, the bias circuit goes in a state in which the fifth and first resistors are inserted in parallel. Accordingly, a substantial resistance of the first resistor appears to be decreased.

As a result, a resistance of the first resistor becomes variable. Consequently, it becomes possible to easily switch the bias points. Therefore, the present invention is effective in realizing a bias circuit and a power amplifier that include a function of switching bias points.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A bias circuit comprising:
   a first transistor having an emitter terminal grounded, a base terminal grounded via a first resistor, and a collector terminal connected to a first power supply port via a second resistor;
   a second transistor having an emitter terminal connected to the base terminal of the first transistor, a base terminal connected to the collector terminal of the first transistor, and a collector terminal provided with power from a second power supply port;
   a third transistor having an emitter terminal grounded, a base terminal connected to the base terminal of the first transistor, and a collector terminal connected to the first power supply port via a third resistor; and
   a fourth transistor having a base terminal connected to the collector terminal of the third transistor, and a collector terminal provided with power from a third power supply port, a current being taken out from the emitter terminal of the fourth transistor.

2. The bias circuit as set forth in claim 1, wherein:
   at least one of the emitter terminal of the first transistor and the emitter terminal of the third transistor is grounded via an adjustment resistor that is a resistor for adjustment.

3. The bias circuit as set forth in claim 1, further comprising:
   a distortion compensation circuit having one terminal connected to the base terminal of the fourth transistor and the other terminal grounded,
   the distortion compensation circuit being composed of a distortion compensation capacitor, a resistor, or a circuit in which a distortion compensation capacitor and a resistor are connected in series.

4. The bias circuit as set forth in claim 1, further comprising:
   a series circuit composed of a fifth resistor and a sixth transistor, the series circuit being connected in parallel with the first resistor,
   the sixth transistor having a base terminal connected to a control terminal via a sixth resistor.

5. A bias circuit comprising:
   a first transistor having an emitter terminal grounded, a base terminal grounded via a first resistor, and a collector terminal connected to a first power supply port via a second resistor;
   a second transistor having an emitter terminal connected to the base terminal of the first transistor, a base terminal connected to the collector terminal of the first transistor, and a collector terminal provided with power from a second power supply port; and
   a third transistor having an emitter terminal grounded, a base terminal connected to the base terminal of the first transistor, and a collector terminal connected to the first power supply port via a third resistor,
   a potential being taken out from the collector terminal of the third transistor.

6. The bias circuit as set forth in claim 5, wherein:
   at least one of the emitter terminal of the first transistor and the emitter terminal of the third transistor is grounded via an adjustment resistor that is a resistor for adjustment.

7. The bias circuit as set forth in claim 5, further comprising:
   a series circuit composed of a fifth resistor and a sixth transistor, the series circuit being connected in parallel with the first resistor
   the sixth transistor having a base terminal connected to a control terminal via a sixth resistor.

8. An power amplifier comprising:
   a plurality of amplifying transistors; and
   bias circuits which supply output currents to base terminals of the plurality of amplifying transistors, respectively,
   each of the bias circuits including:
      a first transistor having an emitter terminal grounded, a base terminal grounded via a first resistor, and a collector terminal connected to a first power supply port via a second resistor;
      a second transistor having an emitter terminal connected to the base terminal of the first transistor, a base terminal connected to the collector terminal of the first transistor, and a collector terminal provided with power from a second power supply port; and
      a plurality of current generating circuits each including (i) a third transistor having an emitter terminal grounded, a base terminal connected to the base terminal of the first transistor, and a collector terminal connected to the first power supply port via a third resistor and (ii) a fourth transistor having a base terminal connected to the collector terminal of the third transistor, and a collector terminal provided with power from a third power supply port, the plurality of current generating circuits each being provided in a pair with corresponding one of the plurality of amplifying transistors,
      an output current being supplied from the emitter terminal of the fourth transistor in each of the plurality of current generating circuits to corresponding one of the base terminals of the plurality of amplifying transistors, the plurality of amplifying transistors each being provided in a pair with corresponding one of the plurality of current generating circuits.

9. The power amplifier as set forth in claim 8, further comprising:
   a power sensor; and a potential generating circuit including a fifth transistor having an emitter terminal grounded, a base terminal connected to the base terminal of the first transistor, and a collector terminal connected to the first power supply port via a fourth resistor, an output voltage being supplied to the power sensor from the collector terminal of the fifth transistor in the potential generating circuit.

10. The power amplifier as set forth in claim 8, wherein:

at least one of the emitter terminal of the first transistor and the emitter terminal of the third transistor in each of the plurality of current generating circuits is grounded via an adjustment resistor that is a resistor for adjustment.

11. The power amplifier as set forth in claim 8, further comprising:

a distortion compensation circuit provided in each of the plurality of current generating circuits, the distortion compensation circuit having one terminal connected to the base terminal of the fourth transistor and the other terminal grounded, the distortion compensation circuit being composed of a distortion compensation capacitor, a resistor, or a circuit in which a distortion compensation capacitor and a resistor are connected in series.

12. The power amplifier as set forth in claim 8 further comprising:

a series circuit composed of a fifth resistor and a sixth transistor, the series circuit being connected in parallel with the first resistor the sixth transistor having a base terminal connected to a control terminal via a sixth resistor.

* * * * *